(12) United States Patent
Wang et al.

(10) Patent No.: US 11,862,216 B2
(45) Date of Patent: Jan. 2, 2024

(54) SHIFT REGISTER AND DRIVING METHOD THEREFOR, GATE DRIVER CIRCUIT, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhu Wang, Beijing (CN); Ling Shi, Beijing (CN); Yipeng Chen, Beijing (CN); Hui Lu, Beijing (CN); Zhenglong Yan, Beijing (CN); Changchang Liu, Beijing (CN); Ke Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/927,535

(22) PCT Filed: Oct. 27, 2021

(86) PCT No.: PCT/CN2021/126754
§ 371 (c)(1),
(2) Date: Nov. 23, 2022

(87) PCT Pub. No.: WO2022/227453
PCT Pub. Date: Nov. 3, 2022

(65) Prior Publication Data
US 2023/0207031 A1   Jun. 29, 2023

(30) Foreign Application Priority Data
Apr. 29, 2021   (CN) .......................... 202110476525.2

(51) Int. Cl.
*G11C 19/02*   (2006.01)
*G09G 3/3233*   (2016.01)
(Continued)

(52) U.S. Cl.
CPC ........... *G11C 19/28* (2013.01); *G09G 3/3233* (2013.01); *G09G 3/3266* (2013.01);
(Continued)

(58) Field of Classification Search
CPC ...... G09G 3/3233; G09G 3/3266; G09G 3/20; G09G 3/3677; G09G 3/32;
(Continued)

(56) References Cited

U.S. PATENT DOCUMENTS

2010/0328281 A1   12/2010   Okada et al.
2017/0004775 A1*   1/2017   Chen ...................... G11C 19/28
(Continued)

FOREIGN PATENT DOCUMENTS

CN   108428425 A   *   8/2018
CN   108428425 A       8/2018
(Continued)

*Primary Examiner* — Brent D Castiaux
(74) *Attorney, Agent, or Firm* — IP & T GROUP LLP

(57) ABSTRACT

A shift register, comprising an input circuit, a first control circuit, a second control circuit and an output circuit. The input circuit is configured to transmit a first voltage signal from a first voltage signal terminal to a first node under the control of an input signal from a signal input terminal. The first control circuit is configured to transmit a second voltage signal from a second voltage signal terminal to a second node under the control of a first clock signal from a first clock signal terminal and the voltage of the first node. The second control circuit is configured to transmit a second clock signal from a second clock signal terminal to a third node under the control of the voltage of the second node. The output circuit is configured to transmit the first voltage (Continued)

signal from the first voltage signal terminal to a scan signal output terminal under the control of the voltage of the third node.

20 Claims, 10 Drawing Sheets

(51) Int. Cl.
 G09G 3/3266 (2016.01)
 G11C 19/28 (2006.01)
(52) U.S. Cl.
 CPC ............... *G09G 2300/0819* (2013.01); *G09G 2300/0842* (2013.01); *G09G 2310/0286* (2013.01); *G09G 2310/08* (2013.01)
(58) Field of Classification Search
 CPC ... G09G 2300/0819; G09G 2300/0842; G09G 2310/0286; G09G 2310/08; G11C 19/28
 See application file for complete search history.

(56) References Cited

U.S. PATENT DOCUMENTS

2018/0330667 A1* 11/2018 Yuan .................... G09G 3/3266
2021/0118375 A1* 4/2021 Yang ..................... G11C 19/28
2021/0217350 A1 7/2021 Yang et al.

FOREIGN PATENT DOCUMENTS

| CN | 108630149 A | 10/2018 |
| CN | 109064993 A | 12/2018 |
| CN | 113192551 A | 7/2021 |

* cited by examiner

SHIFT REGISTER AND DRIVING METHOD THEREFOR, GATE DRIVER CIRCUIT, AND DISPLAY APPARATUS

CROSS-REFERENCE TO RELATED APPLICATIONS

This application is a national phase entry under 35 USC 371 of International Patent Application No. PCT/CN2021/126754, filed on Oct. 27, 2021, which claims priority to Chinese Patent Application No. 202110476525.2, filed on Apr. 29, 2021, which are incorporated herein by reference in their entirety.

TECHNICAL FIELD

The present disclosure relates to the field of display technologies, and in particular, to a shift register and a driving method therefor, a gate driver circuit, and a display apparatus.

BACKGROUND

In a pixel driving circuit, a scan transistor and a reset transistor are turned off most of the time, which require low leakage rates, and a switching transistor and a driving transistor are turned on most of the time, which require high charge mobility. Low temperature polycrystalline oxide (LTPO) pixel driving circuits come into being in combination with advantages of both high stability at a low refresh rate and low production costs of oxide thin film transistors (TFTs), and advantages of high charge mobility of low-temperature polysilicon thin film transistors (LTPS-TFTs).

In the LTPO pixel driving circuit, the scan transistor and the reset transistor adopt N-type oxide TFTs, and the switching transistor and the driving transistor adopt LTPS TFTs. In this way, high charge mobility, high stability and high scalability may be achieved at low production costs.

SUMMARY

In an aspect, a shift register is provided. The shift register includes an input circuit, a first control circuit, a second control circuit and an output circuit.

The input circuit is coupled to a signal input terminal, a first voltage signal terminal and a first node. The input circuit is configured to transmit, under control of an input signal from the signal input terminal, a first voltage signal from the first voltage signal terminal to the first node.

The first control circuit is coupled to the first node, a first clock signal terminal, a second voltage signal terminal and a second node. The first control circuit is configured to transmit, under control of a first clock signal from the first clock signal terminal and a voltage at the first node, a second voltage signal from the second voltage signal terminal to the second node.

The second control circuit is coupled to the second node, a second clock signal terminal and a third node. The second control circuit is configured to transmit, under control of a voltage at the second node, a second clock signal from the second clock signal terminal to the third node.

The output circuit is coupled to the third node, the first voltage signal terminal and a scan signal output terminal. The output circuit is configured to transmit, under control of a voltage at the third node, the first voltage signal from the first voltage signal terminal to the scan signal output terminal.

In some embodiments, the input circuit is further coupled to the second voltage signal terminal and the second node. The input circuit is further configured to transmit, under the control of the input signal from the signal input terminal and the voltage at the second node, the second voltage signal from the second voltage signal terminal to the first node.

The first control circuit is further coupled to the first voltage signal terminal. The first control circuit is further configured to transmit, under the control of the first clock signal from the first clock signal terminal and the voltage at the first node, the first voltage signal from the first voltage signal terminal to the second node.

The second control circuit is further coupled to the first voltage signal terminal. The second control circuit is further configured to transmit, under the control of the voltage at the second node, the first voltage signal from the first voltage signal terminal to the third node.

The output circuit is further coupled to the second voltage signal terminal. The output circuit is further configured to transmit, under the control of the voltage at the third node, the second voltage signal from the second voltage signal terminal to the scan signal output terminal.

In some embodiments, the first control circuit includes a first-level control sub-circuit and a second-level control sub-circuit.

The first-level control sub-circuit is coupled to the first node, the second node, the first voltage signal terminal, the second voltage signal terminal and a fourth node. The first-level control sub-circuit is configured to transmit, under the control of the voltage at the first node, the first voltage signal from the first voltage signal terminal to the second node or the second voltage signal from the second voltage signal terminal to the fourth node.

The second-level control sub-circuit is coupled to the first clock signal terminal, the second node, the first voltage signal terminal and the fourth node. The second-level control sub-circuit is configured to transmit, under the control of the first clock signal from the first clock signal terminal, a voltage at the fourth node or the first voltage signal from the first voltage signal terminal to the second node.

In some embodiments, the first-level control sub-circuit includes a first transistor and a second transistor. A control electrode of the first transistor is coupled to the first node, a first electrode of the first transistor is coupled to the first voltage signal terminal, and a second electrode of the first transistor is coupled to the second node. A control electrode of the second transistor is coupled to the first node, a first electrode of the second transistor is coupled to the second voltage signal terminal, and a second electrode of the second transistor is coupled to the fourth node.

The second-level control sub-circuit includes a third transistor and a fourth transistor. A control electrode of the third transistor is coupled to the first clock signal terminal, a first electrode of the third transistor is coupled to the first voltage signal terminal, and a second electrode of the third transistor is coupled to the second node. A control electrode of the fourth transistor is coupled to the first clock signal terminal, a first electrode of the fourth transistor is coupled to the fourth node, and a second electrode of the fourth transistor is coupled to the second node.

In some embodiments, the second control circuit includes a third-level control sub-circuit and a fourth-level control sub-circuit.

The third-level control sub-circuit is coupled to the second node, the first voltage signal terminal, the second voltage signal terminal and a fifth node. The third-level control sub-circuit is configured to transmit, under the control of the voltage at the second node, the first voltage signal from the first voltage signal terminal or the second voltage signal from the second voltage signal terminal to the fifth node.

The fourth-level control sub-circuit is coupled to the fifth node, the first voltage signal terminal, the second clock signal terminal and the third node. The fourth-level control sub-circuit is configured to transmit, under control of a voltage at the fifth node, the first voltage signal from the first voltage signal terminal or the second clock signal from the second clock signal terminal to the third node.

In some embodiments, the third-level control sub-circuit includes a fifth transistor and a sixth transistor. A control electrode of the fifth transistor is coupled to the second node, a first electrode of the fifth transistor is coupled to the first voltage signal terminal, and a second electrode of the fifth transistor is coupled to the fifth node. A control electrode of the sixth transistor is coupled to the second node, a first electrode of the sixth transistor is coupled to the second voltage signal terminal, and a second electrode of the sixth transistor is coupled to the fifth node.

The fourth-level control sub-circuit includes a seventh transistor and an eighth transistor. A control electrode of the seventh transistor is coupled to the fifth node, a first electrode of the seventh transistor is coupled to the first voltage signal terminal, and a second electrode of the seventh transistor is coupled to the third node. A control electrode of the eighth transistor is coupled to the fifth node, a first electrode of the eighth transistor coupled to the second clock signal terminal, and a second electrode of the eighth transistor is coupled to the third node.

In some embodiments, the second control circuit further includes a fifth-level control sub-circuit. The fifth-level control sub-circuit is coupled to the fifth node, the first voltage signal terminal, the second voltage signal terminal, the second clock signal terminal and the third node. The fifth-level control sub-circuit is configured to transmit, under the control of the voltage at the fifth node, the second clock signal from the second clock signal terminal to the third node.

In some embodiments, the fifth-level control sub-circuit includes a ninth transistor, a tenth transistor and an eleventh transistor. A control electrode of the ninth transistor is coupled to the fifth node, a first electrode of the ninth transistor is coupled to the first voltage signal terminal, and a second electrode of the ninth transistor is coupled to a sixth node. A control electrode of the tenth transistor is coupled to the fifth node, a first electrode of the tenth transistor is coupled to the second voltage signal terminal, and a second electrode of the tenth transistor is coupled to the sixth node. A control electrode of the eleventh transistor is coupled to the sixth node, a first electrode of the eleventh transistor is coupled to the second clock signal terminal, and a second electrode of the eleventh transistor is coupled to the third node.

In some embodiments, the third node is further coupled to a cascade signal output terminal, and the cascade signal output terminal is configured to output a cascade signal to another shift register.

In some embodiments, the output circuit includes a twelfth transistor and a thirteenth transistor. A control electrode of the twelfth transistor is coupled to the third node, a first electrode of the twelfth transistor is coupled to the first voltage signal terminal, and a second electrode of the twelfth transistor is coupled to the scan signal output terminal. A control electrode of the thirteenth transistor is coupled to the third node, a first electrode of the thirteenth transistor is coupled to the second voltage signal terminal, and a second electrode of the thirteenth transistor is coupled to the scan signal output terminal.

In some embodiments, the output circuit includes an odd number of output sub-circuits that are connected in series, a first output sub-circuit is coupled to the third node, and a last output sub-circuit is coupled to the scan signal output terminal.

The first output sub-circuit is configured to transmit, under the control of the voltage at the third node, the first voltage signal from the first voltage signal terminal or the second voltage signal from the second voltage signal terminal to a next output sub-circuit adjacent thereto. The last output sub-circuit is configured to transmit, under control of a signal output by a previous output sub-circuit adjacent thereto, the first voltage signal from the first voltage signal terminal or the second voltage signal from the second voltage signal terminal to the scan signal output terminal.

Other output sub-circuits except the first output sub-circuit and the last output sub-circuit in the odd number of output sub-circuits are each configured to transmit, under control of a signal output by a previous output sub-circuit adjacent thereto, the first voltage signal from the first voltage signal terminal or the second voltage signal from the second voltage signal terminal to a next output sub-circuit adjacent thereto.

In some embodiments, the odd number of output sub-circuits include a first output sub-circuit, a second output sub-circuit, and a third output sub-circuit.

The first output sub-circuit is coupled to the third node, the first voltage signal terminal, the second voltage signal terminal and a seventh node. The first output sub-circuit is configured to transmit, under the control of the voltage at the third node, the first voltage signal from the first voltage signal terminal or the second voltage signal from the second voltage signal terminal to the seventh node.

The second output sub-circuit is coupled to the seventh node, the first voltage signal terminal, the second voltage signal terminal and an eighth node. The second output sub-circuit is configured to transmit, under control of a voltage at the seventh node, the first voltage signal from the first voltage signal terminal or the second voltage signal from the second voltage signal terminal to the eighth node.

The third output sub-circuit is coupled to the eighth node, the first voltage signal terminal, the second voltage signal terminal and the scan signal output terminal. The third output sub-circuit is configured to transmit, under control of a voltage at the eighth node, the first voltage signal from the first voltage signal terminal or the second voltage signal from the second voltage signal terminal to the scan signal output terminal.

In some embodiments, the first output sub-circuit includes a twelfth transistor and a thirteenth transistor. A control electrode of the twelfth transistor is coupled to the third node, a first electrode of the twelfth transistor is coupled to the first voltage signal terminal, and a second electrode of the twelfth transistor is coupled to the seventh node. A control electrode of the thirteenth transistor is coupled to the third node, a first electrode of the thirteenth transistor is coupled to the second voltage signal terminal, and a second electrode of the thirteenth transistor is coupled to the seventh node.

The second output sub-circuit includes a fourteenth transistor and a fifteenth transistor. A control electrode of the fourteenth transistor is coupled to the seventh node, a first electrode of the fourteenth transistor is coupled to the first voltage signal terminal, and a second electrode of the fourteenth transistor is coupled to the eighth node. A control electrode of the fifteenth transistor is coupled to the seventh node, a first electrode of the fifteenth transistor is coupled to the second voltage signal terminal, and a second electrode of the fifteenth transistor is coupled to the eighth node.

The third output sub-circuit includes a sixteenth transistor and a seventeenth transistor. A control electrode of the sixteenth transistor is coupled to the eighth node, a first electrode of the sixteenth transistor is coupled to the first voltage signal terminal, and a second electrode of the sixteenth transistor is coupled to the scan signal output terminal. A control electrode of the seventeenth transistor is coupled to the eighth node, a first electrode of the seventeenth transistor is coupled to the second voltage signal terminal, and a second electrode of the seventeenth transistor is coupled to the scan signal output terminal.

In some embodiments, the input circuit includes a first initialization sub-circuit and a second initialization sub-circuit.

The first initialization sub-circuit is coupled to the first node, the second node, the first voltage signal terminal, the second voltage signal terminal and a ninth node. The first initialization sub-circuit is configured to transmit, under the control of the voltage at the second node, the first voltage signal from the first voltage signal terminal to the first node, or the second voltage signal from the second voltage signal terminal to the ninth node.

The second initialization sub-circuit is coupled to the signal input terminal, the first node, the first voltage signal terminal, the second voltage signal terminal and the ninth node. The second initialization sub-circuit is configured to transmit, under the control of the input signal from the signal input terminal, the first voltage signal from the first voltage signal terminal or a voltage at the ninth node to the first node.

In some embodiments, the first initialization sub-circuit includes an eighteenth transistor and a nineteenth transistor. A control electrode of the eighteenth transistor is coupled to the second node, a first electrode of the eighteenth transistor is coupled to the first voltage signal terminal, and a second electrode of the eighteenth transistor is coupled to the first node. A control electrode of the nineteenth transistor is coupled to the second node, a first electrode of the nineteenth transistor is coupled to the second voltage signal terminal, and a second electrode of the nineteenth transistor is coupled to the ninth node. The second initialization sub-circuit includes a twentieth transistor and a twenty-first transistor. A control electrode of the twentieth transistor is coupled to the signal input terminal, a first electrode of the twentieth transistor is coupled to the first voltage signal terminal, and a second electrode of the twentieth transistor is coupled to the first node. A control electrode of the twenty-first transistor is coupled to the signal input terminal, a first electrode of the twenty-first transistor is coupled to the ninth node, and a second electrode of the twenty-first transistor is coupled to the first node.

In some embodiments, the shift register further includes a reset circuit coupled to the first voltage signal terminal, the second node and a reset signal terminal. The reset circuit is configured to transmit, under control of a reset signal from the reset signal terminal, the first voltage signal from the first voltage signal terminal to the second node.

In some embodiments, the reset circuit includes a twenty-second transistor. A control electrode of the twenty-second transistor is coupled to the reset signal terminal, a first electrode of the twenty-second transistor is coupled to the first voltage signal terminal, and a second electrode of the twenty-second transistor is coupled to the second node.

In another aspect, agate driver circuit is provided. The gate driver circuit includes at least two shift registers as described in any of the above embodiments, the at least two shift registers are cascaded.

In some embodiments, in every two adjacent shift registers, a signal input terminal of a latter-stage shift register is coupled to a cascade signal output terminal of a former-stage shift register, and a signal input terminal of a first-stage shift register is coupled to an initialization signal terminal. The gate driver circuit further includes a first clock signal line, a second clock signal line and a third clock signal line. The first clock signal line is coupled to a first clock signal terminal of each shift register, the second clock signal line is coupled to second clock signal terminals of odd-numbered stages of shift registers, and the third clock signal line is coupled to second clock signal terminals of even-numbered stages of shift registers.

In yet another aspect, a driving method for a shift register is provided. The driving method for the shift register is applied to the shift register as described in any of the above embodiments. The input circuit is further coupled to the second node, and the output circuit is further coupled to the second voltage signal terminal. A frame period includes a charging phase and an output phase, and the driving method includes:

in the charging phase, the input circuit transmitting the first voltage signal from the first voltage signal terminal to the first node under control of a low voltage of the input signal from the signal input terminal; the first control circuit transmitting the second voltage signal from the second voltage signal terminal to the second node under control of a high voltage of the first clock signal from the first clock signal terminal and a high voltage at the first node; the second control circuit transmitting a high voltage of the second clock signal from the second clock signal terminal to the third node under control of a low voltage at the second node; and the output circuit transmitting the second voltage signal from the second voltage signal terminal to the scan signal output terminal under control of a high voltage at the third node; and in the outputting phase, the input circuit transmitting the first voltage signal from the first voltage signal terminal to the first node under the control of the low voltage at the second node; the first control circuit transmitting the second voltage signal from the second voltage signal terminal to the second node under the control of the high voltage of the first clock signal from the first clock signal terminal and the high voltage at the first node; the second control circuit transmitting a low voltage of the second clock signal from the second clock signal terminal to the third node under the control of the low voltage at the second node; and the output circuit transmitting the first voltage signal from the first voltage signal terminal to the scan signal output terminal under control of a low voltage at the third node.

In some embodiments, the input circuit is further coupled to the second voltage signal terminal, the first control circuit is further coupled to the first voltage signal terminal, and the second control circuit is further coupled to the first voltage signal terminal. The frame period further includes a denoising phase, and the driving method further includes: in the denoising phase, the input circuit transmitting the second voltage signal from the second voltage signal terminal to the first node under control of a high voltage of the input signal from the signal input terminal and a high voltage at the second node; the first control circuit transmitting the first voltage signal from the first voltage signal terminal to the second node under control of a low voltage of the first clock signal from the first clock signal terminal and a low voltage at the first node; the second control circuit transmitting the first voltage signal from the first voltage signal terminal to the third node under the control of the high voltage at the second node; and the output circuit transmitting the second voltage signal from the second voltage signal terminal to the scan signal output terminal under the control of the high voltage at the third node.

And/or, the shift register further includes a reset circuit coupled to the first voltage signal terminal, the second node and a reset signal terminal. The frame period further includes a reset phase, and the driving method further includes: in the reset phase, the reset circuit transmitting the first voltage signal from the first voltage signal terminal to the second node under control of a reset signal from the reset signal terminal; the input circuit transmitting the second voltage signal from the second voltage signal terminal to the first node under control of the high voltage of the input signal from the signal input terminal and the high voltage at the second node; and the first control circuit transmitting the first voltage signal from the first voltage signal terminal to the second node under control of the low voltage at the first node.

In yet another aspect, a display apparatus is provided. The display apparatus includes the gate driver circuit as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, but are not limitations on actual sizes of products, actual processes of methods, and actual timings of signals to which the embodiments of the present disclosure relate.

DETAILED DESCRIPTION

Figure 1:
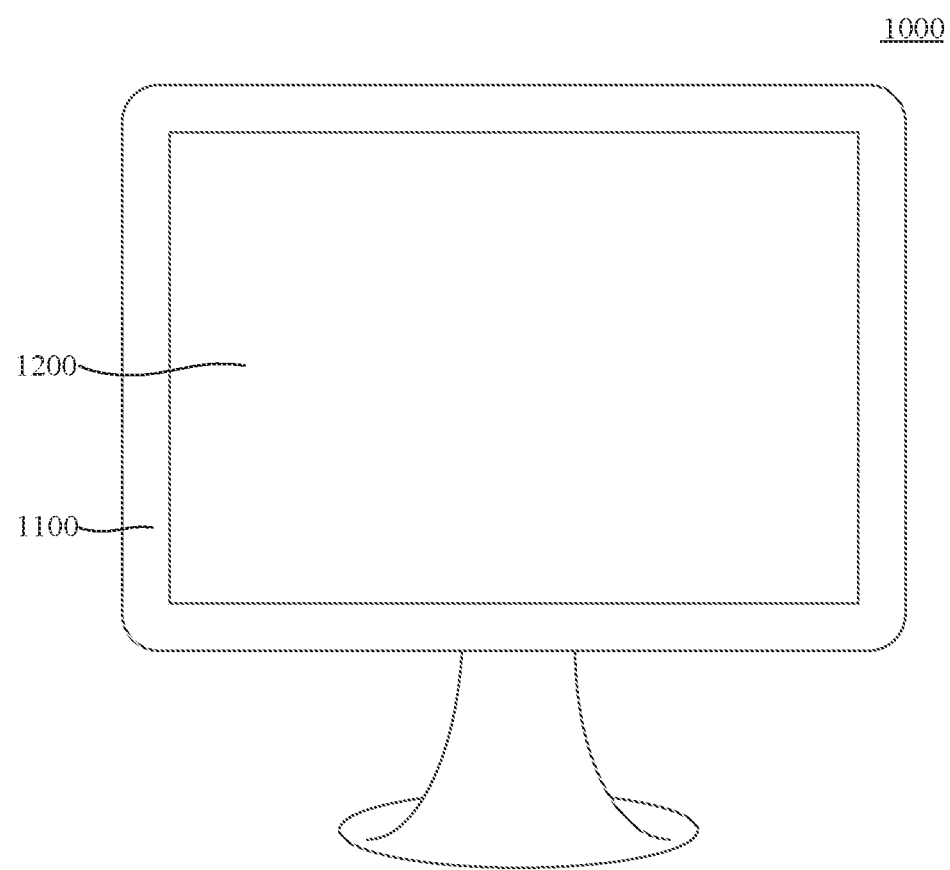
FIG. 1 is a structural diagram of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive meaning, i.e., "including, but not limited to." In the description of the specification, the terms such as "one embodiment," "some embodiments," "exemplary embodiments," "example," "specific example," or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In a shift register provided by the embodiments of the present disclosure, transistors used in the shift register may be thin film transistors (TFTs), field effect transistors (e.g., metal oxide semiconductor field-effect transistors (MOSFETs)), or other switching devices with the same characteristics. The embodiments of the present disclosure are all described by considering an example in which the transistors are the thin film transistors.

In the shift register provided by the embodiments of the present disclosure, a control electrode of each thin film transistor used in the shift register is a gate of the thin film transistor, a first electrode thereof is one of a source and a drain of the thin film transistor, and a second electrode thereof is the other of the source and the drain of the thin film transistor. Since the source and the drain of the thin film transistor may be symmetrical in structure, there may be no difference in structure between the source and the drain of the thin film transistor. That is, there may be no difference in structure between the first electrode and the second electrode of the thin film transistor in the embodiments of the present disclosure. For example, in a case where the transistor is a P-type transistor, the first electrode of the transistor is a source, and the second electrode thereof is a drain. For example, in a case where the transistor is an N-type transistor, the first electrode of the transistor is a drain, and the second electrode thereof is a source.

In the embodiments of the present disclosure, a capacitor may be a capacitor device fabricated separately through a process. For example, the capacitor is realized by fabricating special capacitor electrodes, and each capacitor electrode of the capacitor may be made of a metal layer, a semiconductor layer (e.g., polysilicon doped with impurities), or the like. Alternatively, the capacitor may be may be realized through a parasitic capacitor between transistors, or through a parasitic capacitor between a transistor itself and another device or wire, or through a parasitic capacitor between lines of a circuit itself.

In the shift register provided by the embodiments of the present disclosure, "a first node", "a second node" and the like do not represent actual components, but represent junctions of related electrical connections in a circuit diagram. That is, these nodes are nodes equivalent to the junctions of the related electrical connections in the circuit diagram.

In the shift register provided in the embodiments of the present disclosure, a "low voltage" refers to a voltage that can make an operated P-type transistor included in the shift register turned on, and cannot make an operated N-type transistor included in the shift register turned on (i.e., the N-type transistor is turned off); correspondingly, a "high voltage" refers to a voltage that can make the operated N-type transistor included in the shift register turned on, and cannot make the operated P-type transistor included in the shift register turned on i.e., the P-type transistor is turned off).

As shown in FIG. 1, some embodiments of the present disclosure provide a display apparatus 1000. The display apparatus 1000 may be a television, a mobile phone, a computer, a notebook computer, a tablet computer, a personal digital assistant (PDA), an on-board computer, etc.

As shown in FIG. 1, the display apparatus 1000 includes a frame 1100, and a display panel 1200, a circuit board, a display driver integrated circuit, and other electronic components that are disposed in the frame 1100.

The display panel 1200 may be an organic light-emitting diode (OLED) display panel, a quantum dot light-emitting diode (QLED) display panel, a micro light-emitting diode (micro LED) display panel, which is not limited in the embodiments of the present disclosure.

Some embodiments of the present disclosure will be schematically described below by considering an example in which the display panel 1200 is the OLED display panel.

Figure 2:
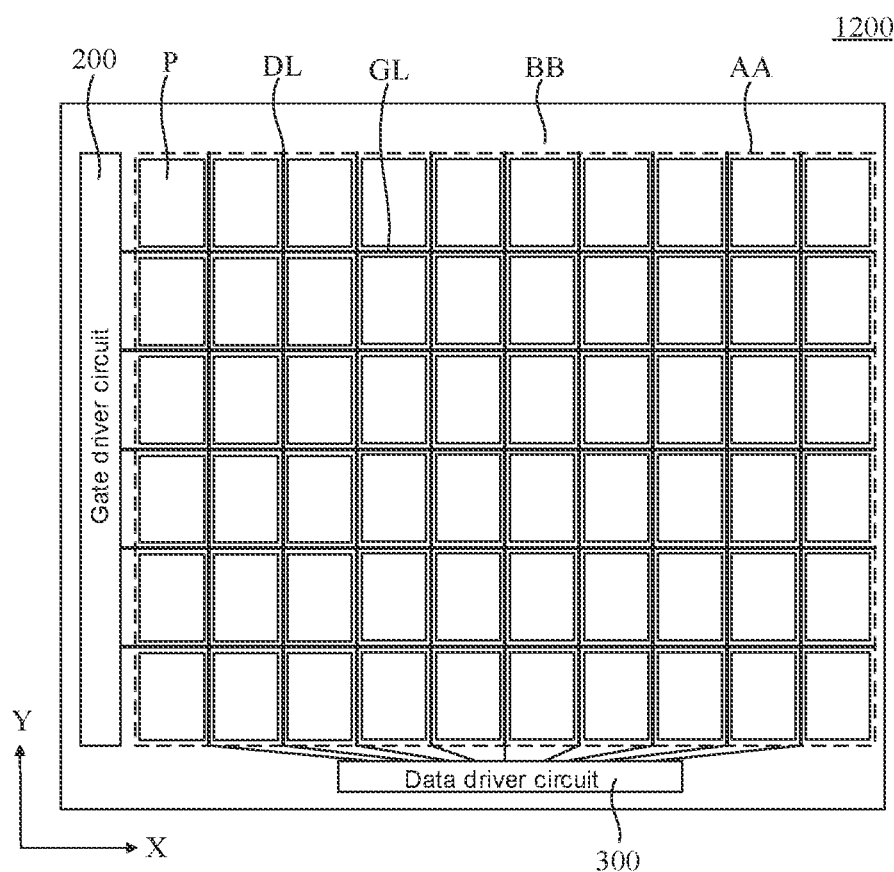
FIG. 2 is a structural diagram of a display panel, in accordance with some embodiments.

In some embodiments, as shown in FIG. 2, the display panel 1200 has a display area AA and a peripheral area BB disposed on at least one side of the display area AA. FIG. 2 shows an example in which the peripheral area BB is disposed around the display area AA.

Figure 3:
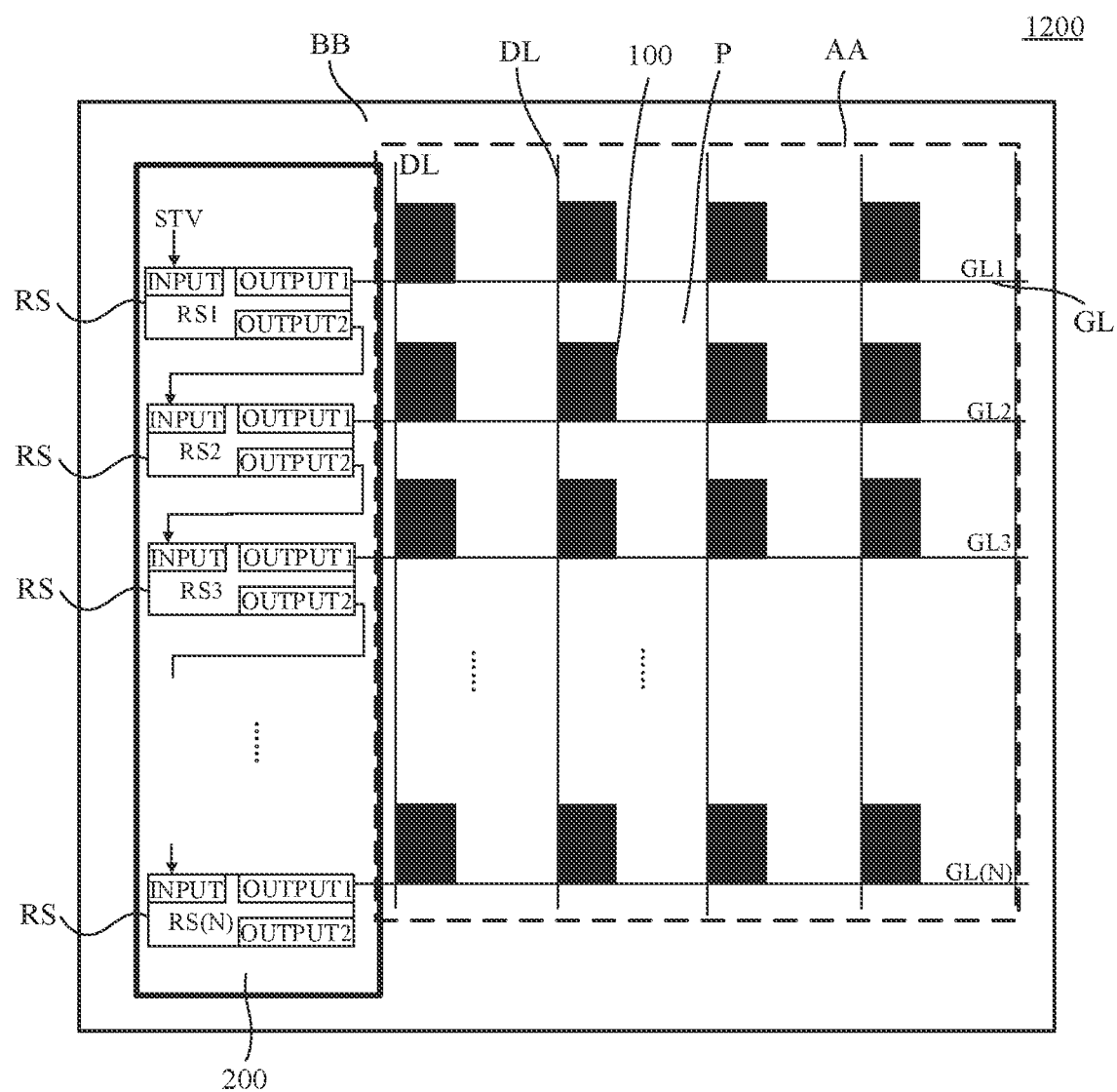
FIG. 3 is an architectural diagram of a gate driver of a display panel, in accordance with some embodiments.

Referring to FIGS. 2 and 3, the display area AA of the display panel 1200 is provided with sub-pixels P of a plurality of light-emitting colors therein. The sub-pixels P of the plurality of light-emitting colors include at least first sub-pixels of which the light-emitting color is a first color, second sub-pixels of which the light-emitting color is a second color, and third sub-pixels of which the light-emitting color is a third color, and the first color, the second color, and the third color are three primary colors (e.g., red, green, and blue).

For convenience of description, the embodiments of the present disclosure will be described by considering an example in which the plurality of sub-pixels P are arranged in a matrix form. In this case, sub-pixels P arranged in a line in a horizontal direction X are referred to as sub-pixels P in a same row, and sub-pixels P arranged in a line in a vertical direction Y are referred to as sub-pixels P in a same column.

Figure 4A:
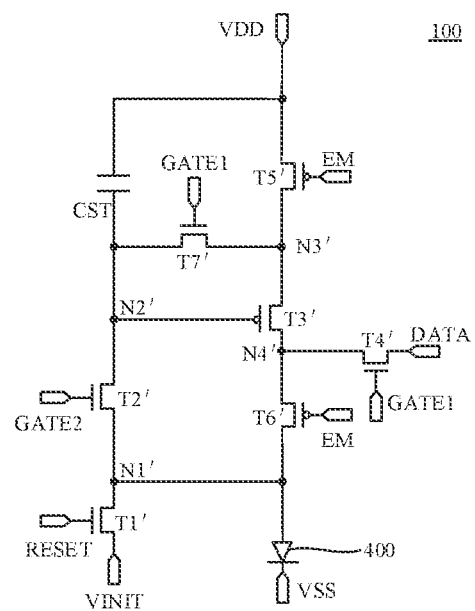
FIG. 4A is a structural diagram of a pixel driving circuit, in accordance with some embodiments.

Referring to FIGS. 3 and 4A, each sub-pixel P includes a pixel driving circuit 100. Control electrodes of transistors in the pixel driving circuits 100 located in a same row are coupled to a same gate line GL, and first electrodes (e.g., sources) of the transistors of the pixel driving circuits 100 located in a same column are coupled to a same data line DL.

In some embodiments, referring to FIG. 4A, the pixel driving circuit 100 includes a driving transistor and six switching transistors. The driving transistor and the six switching transistors may use low-temperature polysilicon thin film transistors, or use oxide thin film transistors, or use both the low-temperature polysilicon thin film transistors and the oxide thin film transistors.

An active layer of the low-temperature polysilicon thin film transistor uses low-temperature polysilicon (LTPS), and an active layer of the oxide thin film transistor uses oxide semiconductor such as indium gallium zinc oxide or indium gallium tin oxide. The low-temperature polysilicon thin film transistor has the advantages of high mobility and high charging rate, and the oxide thin film transistor has the advantages of low leakage current. The low-temperature polysilicon thin film transistor and the oxide thin film transistor are integrated into a display panel to produce a low-temperature polycrystalline oxide (LTPO) display panel, which may realize low-frequency drive, reduce power consumption, and improve display quality by utilizing the advantages of both the low temperature polysilicon thin film transistor and the oxide thin film transistor.

With reference to FIGS. 2, 4A, 4B, 4C, and 4D, the pixel driving circuit 100 included in the LTPO display panel will be schematically described below by considering an example in which the pixel driving circuit 100 includes seven transistors T1' to T7' and one capacitor CST. In the following description, the pixel driving circuit 100 is any of the pixel driving circuits 100 located in the sub-pixels P in an N-th row, and N is a positive integer.

For example, as shown in FIG. 4A, the pixel driving circuit 100 includes seven transistors T1' to T7' and one capacitor CST. In the pixel driving circuit 100, a control electrode of a first transistor T1' is coupled to a reset signal terminal RESET, control electrodes of a fourth transistor T4' and a seventh transistor T7' are both coupled to a first scan signal terminal GATE1, and a control electrode of a second transistor T2' is coupled to a second scan signal terminal GATE2. The first transistor T1' is a reset transistor, the second transistor T2', the fourth transistor T4', and the seventh transistor T7' are scan transistors, and the first transistor T1', the second transistor T2', the fourth transistor T4' and the seventh transistor T7' are all N-type oxide TFTs. A control electrode of a third transistor T3' is coupled to an end of the capacitor CST, and control electrodes of a fifth transistor T5' and a sixth transistor T6' are both coupled to an enable signal terminal EM. The third transistor T3' is a driving transistor, the fifth transistor T5' and the sixth transistor T6' are switching transistors, and the third transistor T3', the fifth transistor T5' and the sixth transistor T6' are all P-type low-temperature polysilicon TFTs.

In this case, high charge mobility, high stability and high scalability may be achieved at low production costs in combination with the advantages of both the high stability at the low refresh rate and the low production costs of the oxide TFTs and the advantages of the high mobility of the LTPS-TFTs.

It will be noted that first scan signal terminals GATE1 of the pixel driving circuits 100 in the sub-pixels in the N-th row are coupled to a gate line GL(N), second scan signal terminals GATE2 of the pixel driving circuits 100 in the sub-pixels in the N-th row are coupled to a gate line GL(N−1), and reset signal terminals RESET of the pixel driving circuits 100 in the sub-pixels in the N-th row are coupled to the gate line GL(N−1). Of course, the second scan signal terminals GATE2 and the reset signal terminals RESET may be coupled to two gate lines GL, respectively, and a gate line GL coupled to the reset signal terminals RESET and a gate line GL coupled to the second scan signal terminals GATE2 may be respectively driven by different gate driver circuits 200.

Figure 4B:
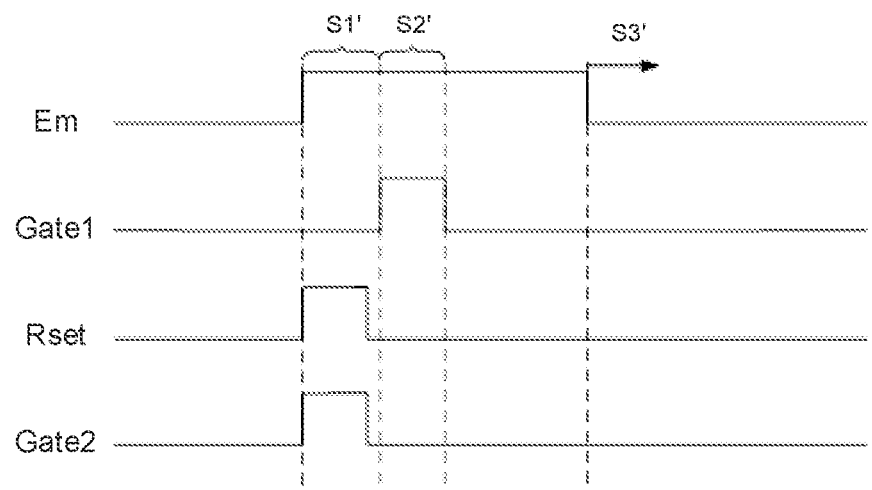
FIG. 4B is a driving timing diagram of the pixel driving circuit shown in FIG. 4A.

Referring to FIG. 4B, a frame period of the pixel driving circuit 100 includes a reset phase S1', a scanning phase S2', and a light-emitting phase S3'. In the reset phase S1', the first transistor T1' is turned on under control of a reset signal Reset from the reset signal terminal RESET, the second transistor T2' is turned on under control of a second scan signal Gate2 from the second scan signal terminal GATE2, and voltages at a first node N1' and a second node N2' are reset to be initialization voltage signals. In the scanning phase S2', the fourth transistor T4' and the seventh transistor T7' are both turned on under control of a first scan signal Gate1 from the first scan signal terminal GATE1, the third transistor T3 is turned on under control of the voltage at the second node N2', and a data signal from a data signal terminal DATA is written into the capacitor CST. In the light-emitting phase S3', the fifth transistor T5' and the sixth transistor T6' are turned on under control of an enable signal Em from the enable signal terminal EM, and the third transistor T3' is turned on under control of the voltage at the second node N2', so as to output a driving current signal to an element to be driven 400.

However, the above-mentioned pixel driving circuit needs to be driven by scan signals (i.e., high-voltage signals) suitable for the N-type transistors, and the scan transistors are all oxide TFTs, which have charge mobility lower than charge mobility of low-temperature polycrystalline oxide TFTs and a poor writing ability. Therefore, an output ability of the gate driver circuit needs to be improved.

Figure 4C:
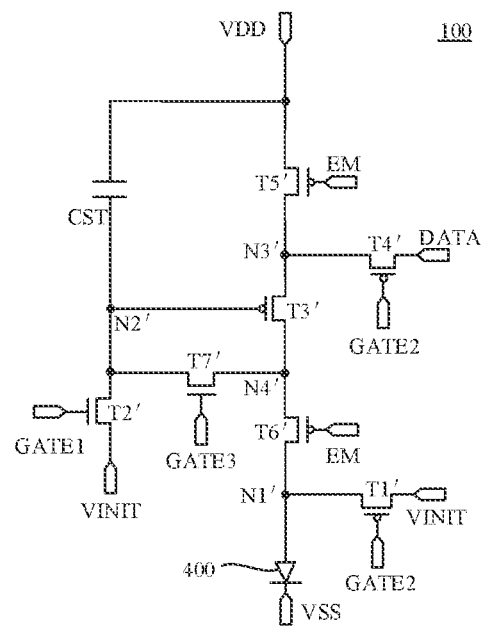
FIG. 4C is a structural diagram of another pixel driving circuit, in accordance with some embodiments.

For example, as shown in FIG. 4C, the pixel driving circuit 100 includes seven transistors T1' to T7' and one capacitor CST. In the pixel driving circuit 100, control electrodes of a second transistor T2' and a seven transistor T7' are respectively coupled to a first scan signal terminal GATE1 and a third scan signal terminal GATE3, and control electrodes of a first transistor T1 and a fourth transistor T4' are coupled to a second scan signal terminal GATE2. The first transistor T1', the second transistor T2', the fourth transistor T4', and the seven transistor T7' are all scan transistors, the first transistor T1' and the fourth transistor T4' are P-type low-temperature polysilicon TFTs, and the second transistor T2' and the seven transistor T7' are N-type oxide TFTs. A control electrode of a third transistor T3' is coupled to an end of the capacitor CST, and control electrodes of a fifth transistor T5' and a sixth transistor T6' are both coupled to an enable signal terminal EM. The third transistor T3' is a driving transistor, the fifth transistor T5' and the sixth transistor T6' are switching transistors.

In this case, high charge mobility, high stability and high scalability may be achieved at low production costs in combination with the advantages of both the high stability at the low refresh rate and the low production costs of the oxide TFTs and the advantages of the high mobility of the LTPS-TFTs.

It will be noted that first scan signal terminals GATE1 of the pixel driving circuits 100 in the sub-pixels in the N-th row are coupled to a gate line GL(N−1) transmitting an N-type scan signal, second scan signal terminals GATE2 of the pixel driving circuits 100 in the sub-pixels in the N-th row are coupled to a gate line GL(N) transmitting a P-type scan signal, and third scan signal terminals GATE3 of the pixel driving circuits 100 in the sub-pixels in the N-th row are coupled to another gate line GL(N) transmitting an N-type scan signal.

Figure 4D:
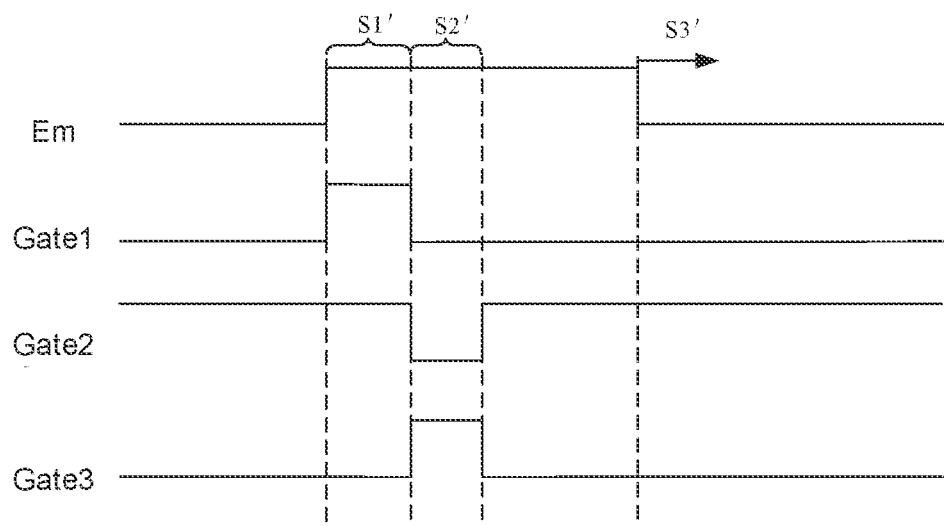
FIG. 4D is a driving timing diagram of the pixel driving circuit shown in FIG. 4C.

Referring to FIG. 4D, a frame period of the pixel driving circuit 100 includes a reset phase S1', a scanning phase S2', and a light-emitting phase S3'. In the reset phase S1', the second transistor T2' is turned on under control of a first scan signal Gate1 from the first scan signal terminal GATE1, and a voltage at a second node N2' is reset to be an initialization voltage signal.

In the scanning phase S2', the first transistor T1' is turned on under control of a second scan signal Gate2 from the second scan signal terminal GATE2, and a voltage at a first node N1' is reset to be an initialization voltage signal; the fourth transistor T4' is turned on under control of the second scan signal Gate2 from the second scan signal terminal GATE2, the seventh transistor T7' is turned on under control of a third scan signal Gate3 from the third scan signal terminal GATE3, and a data signal from the data signal terminal DATA is written into the capacitor CST.

In the light-emitting phase S3', the fifth transistor T5' and the sixth transistor T6' are turned on under control of an enable signal Em from the enable signal terminal EM, and the third transistor T3' is turned on under control of the voltage at the second node N2', so as to output a driving current signal to an element to be driven 400.

However, since the above pixel driving circuit 100 needs to be driven by scan signals suitable for the N-type transistor (i.e., high-voltage signals) and scan signals suitable for the P-type transistor (i.e., low-voltage signals), the gate driver circuit needs to provide both a high-voltage scan signal and a low-voltage scan signal.

As shown in FIG. 2, the peripheral area BB of the display panel 1200 is provided with the gate driver circuit 200 and a data driver circuit 300 therein. In some embodiments, the gate driver circuit 200 may be disposed on a side in an extending direction of the gate lines GL, and the data driver circuit 300 may be disposed on a side in an extending direction of the data lines DL, so as to drive the pixel driving circuits 100 in the display panel 1200 for display.

In some embodiments, the gate driver circuit 200 is a gate driver integrated circuit (IC). In some other embodiments, the gate driver circuit 200 is a gate driver on array (GOA) circuit, that is, the gate driver circuit 200 is directly integrated on an array substrate of the display panel 1200.

Compared with a case where the gate driver circuit 200 is set to be the gate driver IC, setting the gate driver circuit 200 as the GOA circuit may reduce manufacturing costs of the display panel 1200 and reduce a frame size of the display panel 1200, so as to realize a narrow frame design. The following embodiments are all described by considering an example in which the gate driver circuit 200 is the GOA circuit.

It will be noted that FIGS. 2 and 3 are only schematic and described by considering an example in which the gate driver circuit 200 is disposed on a single side of the peripheral area BB of the display panel 1200, and the gate lines GL are sequentially driven row by row from the single side, i.e., single-sided driving. In some embodiments, the gate driver circuits 200 may be respectively disposed on two sides, in an extending direction of the gate lines GL, of the peripheral area BB of the display panel 1200, and the gate lines GL are sequentially driven row by row from two sides simultaneously by the two gate driver circuits 200, i.e., double-sided driving. In some other embodiments, the gate driver circuits 200 may be respectively disposed on two sides, in the extending direction of the gate lines GL, of the peripheral region BB of the display panel 1200, and the gate lines GL are sequentially driven row by row from two sides alternately by the two gate driver circuits 200, i.e., alternate driving. The following embodiments of the present disclosure are all described by considering an example of the single-sided driving.

In some embodiments of the present disclosure, as shown in FIG. 3, the gate driver circuit 200 includes at least two shift registers RS that are cascaded.

Referring to FIG. 3, the gate driver circuit 200 includes N shift registers RS (RS1, RS2, . . . , RS(N)) that are cascaded. In this case, the N shift registers RS (RS1, RS2, . . . , RS(N)) that are cascaded are connected to N gate lines (GL1, GL2, . . . , GL(N)) in one-to-one correspondence, where N is a positive integer.

Figure 10:
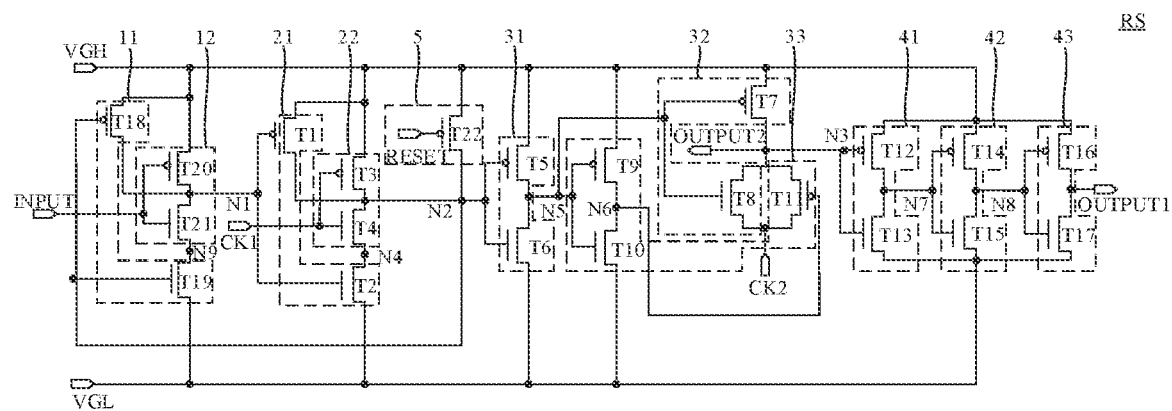
FIG. 10 is a circuit structure diagram of another shift register, in accordance with some embodiments.

In some embodiments, as shown in FIGS. 3 and 10, in the shift registers RS (RS1, RS2, . . . , RS(N)) in the gate driver circuit 200, a scan signal output terminal OUTPUT1 and a cascade signal output terminal OUTPUT2 are set separately. A gate scan signal is output to a gate line GL connected to the shift register through the scan signal output terminal OUTPUT1, and a cascade signal is output through the cascade signal output terminal OUTPUT2.

For example, in every two adjacent shift registers RS, a signal input terminal INPUT of a latter-stage shift register RS is coupled to the cascade signal output terminal OUTPUT2 of a former-stage shift register RS, and the signal input terminal INPUT of a first-stage shift register RS1 is coupled to an initialization signal terminal STV.

Figure 5:
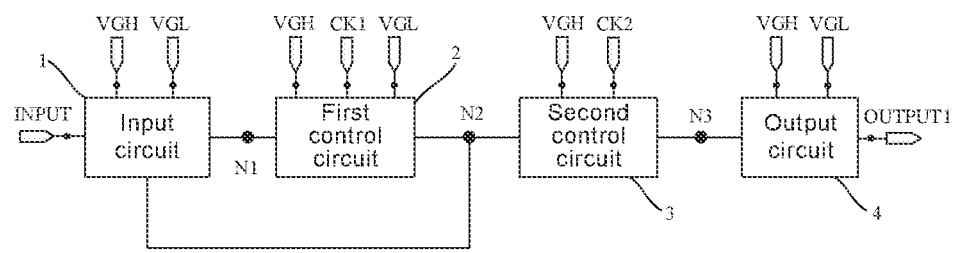
FIG. 5 is a block diagram of a circuit structure of a shift register, in accordance with some embodiments.

Some embodiments of the present disclosure provide a shift register RS. As shown in FIG. 5, the shift register RS includes an input circuit 1, a first control circuit 2, a second control circuit 3, and an output circuit 4.

The input circuit 1 is coupled to the signal input terminal INPUT, a first voltage signal terminal VGH and a first node N1. The input circuit INPUT is configured to transmit, under control of an input signal Input from the signal input terminal INPUT, a first voltage signal Vgh from the first voltage signal terminal VGH to the first node N1.

For example, in a case where a voltage of the input signal Input transmitted by the signal input terminal INPUT is a low voltage, the input circuit 1 may be turned on under control of the low voltage of the input signal Input from the signal input terminal INPUT to transmit the first voltage signal Vgh from the first voltage signal terminal VGH to the first node N1.

For example, in a charging phase S2 (referring to FIG. 13), the voltage of the input signal Input transmitted by the signal input terminal INPUT is the low voltage, the input circuit 1 is turned on under the control of the low voltage of the input signal Input from the signal input terminal INPUT to transmit the first voltage signal Vgh from the first voltage signal terminal VGH to the first node N1, so that a voltage at the first node N1 is raised.

The first control circuit 2 is coupled to the first node N1, a first clock signal terminal CK1, a second voltage signal terminal VGL and a second node N2. The first control circuit 2 is configured to transmit, under control of a first clock signal Ck1 from the first clock signal terminal CK1 and the voltage at the first node N1, a second voltage signal Vgl from the second voltage signal terminal VGL to the second node N2.

For example, in a case where a voltage of the first clock signal Ck1 from the first clock signal terminal CK1 is a high voltage, and the voltage at the first node N1 is a high voltage, the first control circuit 2 may be turned on under control of the high voltage of the first clock signal Ck1 from the first clock signal terminal CK1 and the high voltage at the first node N1 to transmit the second voltage signal Vgl from the second voltage signal terminal VGL to the second node N2.

For example, in the charging phase S2 (referring to FIG. 13), the voltage of the first clock signal Ck1 transmitted by the first clock signal terminal CK1 is the high voltage, the voltage at the first node N1 is the high voltage, and the first control circuit 2 is turned on under the control of the high voltage of the first clock signal Ck1 from the first clock signal terminal CK1 and the high voltage at the first node N1 to transmit the second voltage signal Vgl from the second voltage signal terminal VGL to the second node N2, so that a voltage at the second node N2 is lowered.

The second control circuit 3 is coupled to the second node N2, a second clock signal terminal CK2, and a third node N3. The second control circuit 3 is configured to transmit, under control of the voltage at the second node N2, a second clock signal Ck2 from the second clock signal terminal CK2 to the third node N3.

For example, in a case where the voltage at the second node N2 is a low voltage, the second control circuit 3 may be turned on under control of the low voltage at the second node N2 to transmit the second clock signal Ck2 from the second clock signal terminal CK2 to the third node N3.

For example, in an outputting phase S3 (referring to FIG. 13), the second clock signal Ck2 is the low voltage, the voltage at the second node N2 is the low voltage, and the second control circuit 3 is turned on under control of the low voltage at the second node N2 to transmit the low voltage of the second clock signal Ck2 from the second clock signal terminal CK2 to the third node N3, so that a voltage at the third node N3 is lowered.

The output circuit 4 is coupled to the third node N3, the first voltage signal terminal VGH, and a scan signal output terminal OUTPUT1. The output circuit 4 is configured to transmit, under control of the voltage at the third node N3, the first voltage signal Vgh from the first voltage signal terminal VGH to the scan signal output terminal OUTPUT1.

For example, in a case where the voltage at the third node N3 is a low voltage, the output circuit 4 may be turned on under control of the low voltage at the third node N3 to transmit the first voltage signal Vgh from the first voltage signal terminal VGH to the scan signal output terminal OUTPUT1.

For example, in the outputting phase S3 (referring to FIG. 13), the voltage at the third node N3 is the low voltage, and the output circuit 4 is turned on under control of the low voltage at the third node N3 to transmit the first voltage signal Vgh from the first voltage signal terminal VGH to the scan signal output terminal OUTPUT1, so that the scan signal output terminal OUTPUT1 of the shift register RS outputs the scan signal.

It will be noted that the second voltage signal terminal VGL is configured to transmit a direct current low-voltage signal (low voltage), and the first voltage signal terminal VGH is configured to transmit a direct current high-voltage signal (high voltage).

It can be seen from the above that in the shift register RS provided by some embodiments of the present disclosure, the input circuit 1 is turned on under the control of the low voltage of the input signal Input from the signal input terminal INPUT to transmit the first voltage signal Vgh from the first voltage signal terminal VGH to the first node N1; the first control circuit 2 transmits, under the control of the high voltage of the first clock signal Ck1 from the first clock signal terminal CK1 and the high voltage at the first node N1, the second voltage signal Vgl from the second voltage signal terminal VGL to the second node N2; the second control circuit 3 transmits, under the control of the low voltage at the second node N2, the low voltage of the second clock signal Ck2 from the second clock signal terminal CK2 to the third node N3; and the output circuit 4 transmits, under the control of the low voltage at the third node N3, the first voltage signal Vgh from the first voltage signal terminal VGH to the scan signal output terminal OUTPUT1, so that the scan signal output terminal OUTPUT1 of the shift register RS outputs the scan signal.

In this way, in the outputting phase S3 (referring to FIG. 13), the output circuit 4 transmits the first voltage signal Vgh from the first voltage signal terminal VGH to the scan signal output terminal OUTPUT1, so as to output the scan signal. The shift register RS outputting the scan signal through a constant voltage terminal (the first voltage signal terminal VGH), compared with a case where the scan signal is output through a square wave pulse signal terminal (the output voltages including a low voltage and a high voltage), may reduce an influence of load of the scan signal output terminal OUTPUT1 on the voltage signal output by the shift register RS. The voltage signal output by the scan signal output terminal OUTPUT1 of the shift register RS is more stable, which may improve display stability.

In addition, according to the driving requirements of the pixel driving circuit 100, a magnitude of the voltage of the first voltage signal Vgh of the first voltage signal terminal VGH is controlled, so that the driving requirements of the pixel driving circuit may be met.

For example, for the LTPO pixel driving circuit shown in FIG. 4A, the scan transistors (i.e., T2', T4', and T7') and the reset transistor (i.e., T1') are N-type transistors, and need to be turned on at a high voltage. The voltage of the first voltage signal Vgh from the first voltage signal terminal VGH is controlled to be the high voltage, so that the high voltage required for turning on the scan transistors and the reset transistor may be output through the above shift register RS.

For example, for the LTPO pixel driving circuit shown in FIG. 4C, the second transistor T2' and the seventh transistor T7' are N-type transistors, and need to be turned on at a high voltage. The voltage of the first voltage signal Vgh from the first voltage signal terminal VGH is controlled to be the high voltage, so that the high voltage required for turning on the second transistor T2' and the seventh transistor T7' may be output through the above shift register RS.

It will be noted that the shift register RS provided by the embodiments of the present disclosure is not only used in the LTPO pixel driving circuits shown in FIGS. 4A and 4C, but also used in other LTPO pixel driving circuits 100 in which at least a part of the scan transistors use N-type transistors.

Figure 6:
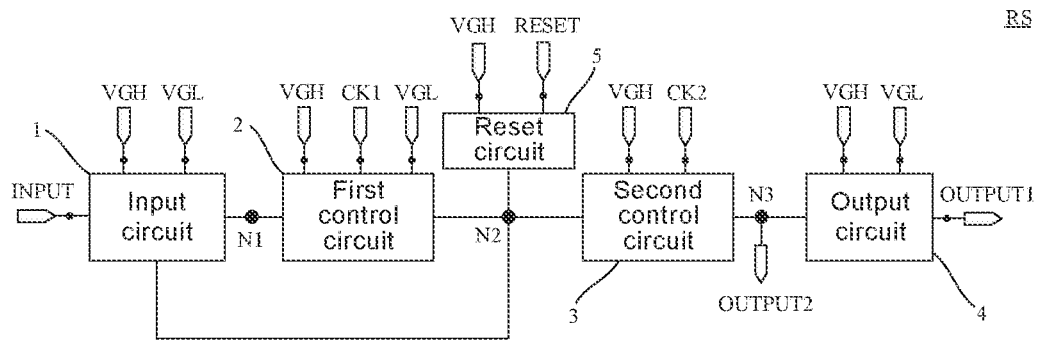
FIG. 6 is a block diagram of a circuit structure of another shift register, in accordance with some embodiments.

In some embodiments, as shown in FIGS. 5 and 6, the input circuit 1 is further coupled to the second voltage signal terminal VGL and the second node N2. The input circuit 1 is further configured to transmit, under control of the input signal Input from the signal input terminal INPUT and the voltage at the second node N2, the second voltage signal Vgl from the second voltage signal terminal VGL to the first node N1.

For example, in a case where the voltage of the input signal Input transmitted by the signal input terminal INPUT is a high voltage, and the voltage at the second node N2 is a high voltage, the input circuit 1 may be turned on under control of the high voltage of the input signal Input from the signal input terminal INPUT and the high voltage at the second node N2 to transmit the second voltage signal Vgl from the second voltage signal terminal VGL to the first node N1.

For example, in a denoising phase S4 (referring to FIG. 13), the voltage of the input signal Input transmitted by the signal input terminal INPUT is the high voltage, the voltage at the second node N2 is the high voltage, and the input circuit 1 is turned on under the control of the high voltage of the input signal Input from the signal input terminal INPUT and the high voltage at the second node N2 to transmit the second voltage signal Vgl from the second voltage signal terminal VGL to the first node N1, so that the voltage at the first node N1 is lowered.

The first control circuit 2 is further coupled to the first voltage signal terminal VGH. The first control circuit 2 is further configured to transmit, under control of the first clock signal Ck1 from the first clock signal terminal CK1 and the voltage at the first node N1, the first voltage signal Vgh from the first voltage signal terminal VGH to the second node N2.

For example, in a case where the voltage of the first clock signal Ck1 transmitted by the first clock signal terminal CK1 is a low voltage, and the voltage at the first node N1 is a low voltage, the first control circuit 2 may be turned on under control of the low voltage of the first clock signal Ck1 from the first clock signal terminal CK1 and the low voltage at the first node N1 to transmit the first voltage signal Vgh from the first voltage signal terminal VGH to the second node N2.

For example, in the denoising phase S4 (referring to FIG. 13), the voltage of the first clock signal Ck1 transmitted by the first clock signal terminal CK1 is the low voltage, the voltage at the first node N1 is the low voltage, and the first control circuit 2 is turned on under the control of the low voltage of the first clock signal Ck1 from the first clock signal terminal CK1 and the low voltage at the first node N1 to transmit the first voltage signal Vgh from the first voltage signal terminal VGH to the second node N2, so that the voltage of the second node N2 is raised.

The second control circuit 3 is further coupled to the first voltage signal terminal VGH. The second control circuit 3 is further configured to transmit, under control of the voltage at the second node N2, the first voltage signal Vgh from the first voltage signal terminal VGH to the third node N3.

For example, in a case where the voltage at the second node N2 is a high voltage, the second control circuit 3 may be turned on under control of the high voltage at the second node N2 to transmit the first voltage signal Vgh from the first voltage signal terminal VGH to the third node N3.

For example, in the denoising phase S4 (referring to FIG. 13), the voltage at the second node N2 is the high voltage, and the second control circuit 3 is turned on under the control of the voltage at the second node N2 to transmit the first voltage signal Vgh from the first voltage signal terminal VGH to the third node N3, so that the voltage at the third node N3 is raised.

The output circuit 4 is further coupled to the second voltage signal terminal VGL. The output circuit 4 is further configured to transmit, under control of the voltage at the third node N3, the second voltage signal Vgl from the second voltage signal terminal VGL to the scan signal output terminal OUTPUT1.

For example, in a case where the voltage at the third node N3 is a high voltage, the output circuit 4 may be turned on under control of the high voltage at the third node N3 to transmit the second voltage signal Vgl from the second voltage signal terminal VGL to the scan signal output terminal OUTPUT1.

For example, in the denoising phase S4 (referring to FIG. 13), the voltage at the third node N3 is the high voltage, the output circuit 4 is turned on under the control of the high voltage at the third node N3 to transmit the second voltage signal Vgl from the second voltage signal terminal VGL to the scan signal output terminal OUTPUT1, so as to stop the output of the scan signal, and perform a denoising processing on the scan signal output terminal OUTPUT1.

It can be seen from the above that in the shift register RS provided by some embodiments of the present disclosure, the input circuit 1 is turned on under the control of the high voltage of the input signal Input from the signal input terminal INPUT and the high voltage at the second node N2 to transmit the second voltage signal Vgl from the second voltage signal terminal VGL to the first node N1; the first control circuit 2 is turned on under the control of the low voltage of the first clock signal Ck1 from the first clock signal terminal CK1 and the low voltage at the first node N1 to transmit the first voltage signal Vgh from the first voltage signal terminal VGH to the second node N2; the second control circuit 3 is turned on under the control of the voltage at the second node N2 to transmit the first voltage signal Vgh from the first voltage signal terminal VGH to the third node N3; and the output circuit 4 is turned on under the control of the high voltage at the third node N3 to transmit the second voltage signal Vgl from the second voltage signal terminal VGL to the scan signal output terminal OUTPUT1, so that the denoising processing is performed on the scan signal output terminal OUTPUT1.

In this way, after the outputting phase S3 (referring to FIG. 13), the output circuit 4 transmits the second voltage signal Vgl from the second voltage signal terminal VGL to the scan signal output terminal OUTPUT1, so as to perform denoising on the scan signal output terminal OUTPUT1 continuously.

The third node N3 is further coupled to a cascade signal output terminal OUTPUT2, and the cascade signal output terminal OUTPUT2 is configured to output a cascade signal to another shift register RS, so as to provide an input signal Input for the another shift register RS. In addition, the scan signal and the cascade signal are respectively output through the scan signal output terminal OUTPUT1 and the cascade signal output terminal OUTPUT2, so that the scan signal and the cascade signal will not interfere with each other, and the output is relatively stable.

In addition, the cascade signal output terminal OUTPUT2 may further be configured to provide a P-type scan signal for the second scan signal terminal GATE2 of the pixel driving circuit shown in FIG. 4C.

For example, for the LTPO pixel driving circuit shown in FIG. 4C, the second transistor T2' and the seventh transistor T7' are N-type transistors, and need to be turned on at the high voltage. The voltage of the first voltage signal Vgh from the first voltage signal terminal VGH is controlled to be the high voltage, so that the high voltage required for turning on the second transistor T2' and the seventh transistor T7' may be output through the scan signal output terminal OUTPUT1 of the above shift register RS. The first transistor T1' and the fourth transistor T4' are P-type transistors, and need to be turned on at a low voltage. The second clock signal Ck2 from the second clock signal terminal CK2 is controlled to be at the low voltage, so that the low voltage required for turning on the first transistor T1' and the fourth transistor T4' may be output through the cascade signal output terminal OUTPUT2 of the above shift register RS.

It will be noted that the shift register RS provided by the embodiments of the present disclosure is not only used in the LTPO pixel driving circuit shown in FIG. 4C, but also used in other LTPO pixel driving circuits 100 in which at least a part of the scan transistors use N-type transistor(s) and P-type transistor(s).

Figure 7:
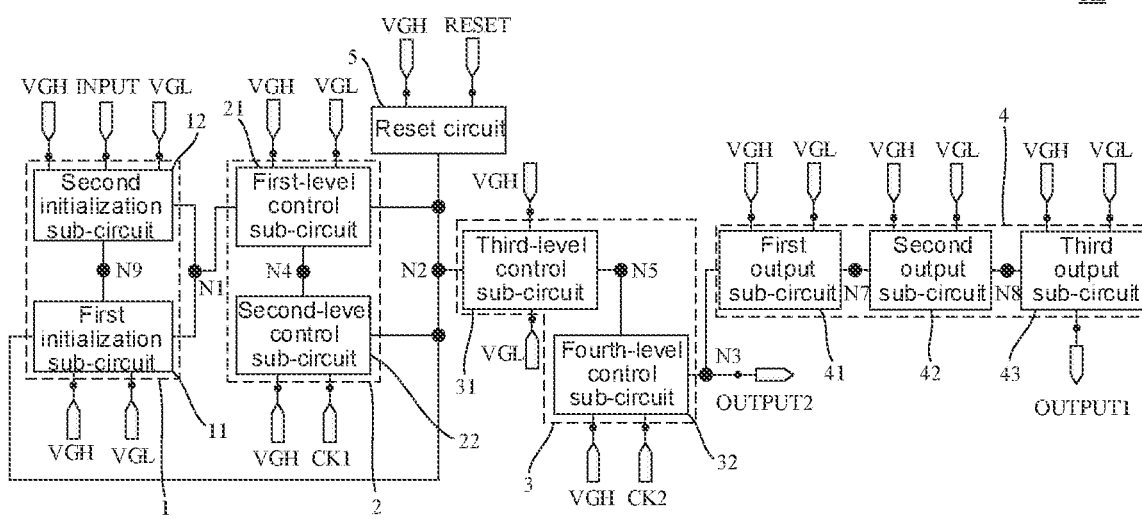
FIG. 7 is a block diagram of a circuit structure of yet another shift register, in accordance with some embodiments.
Figure 9:
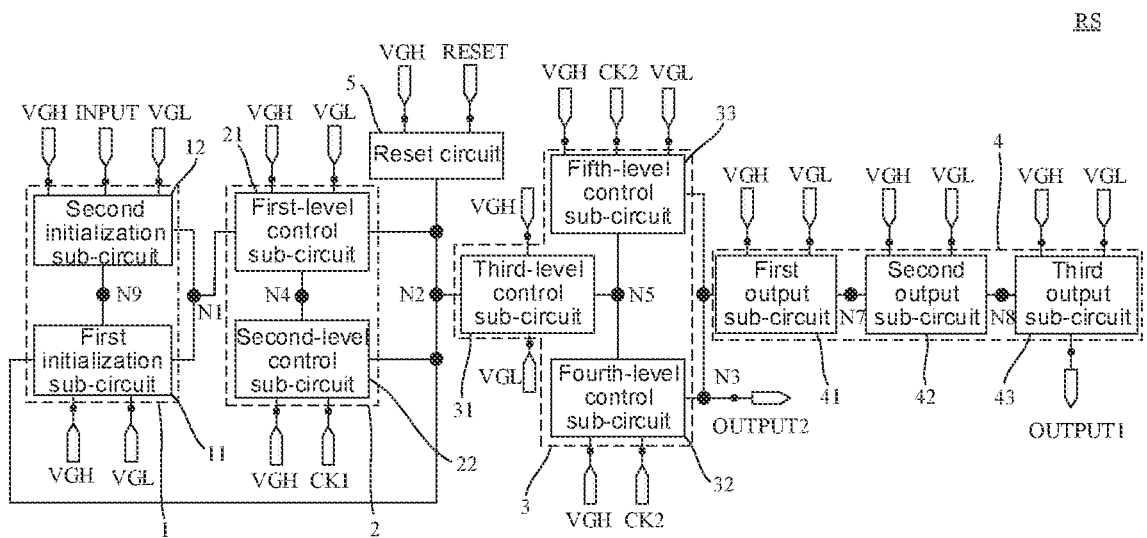
FIG. 9 is a block diagram of a circuit structure of yet another shift register, in accordance with some embodiments.

In some embodiments, as shown in FIGS. 6, 7 and 9, the shift register RS further includes a reset circuit 5 coupled to the first voltage signal terminal VGH, the second node N2, and a reset signal terminal RESET. The reset circuit 5 is configured to transmit, under control of a reset signal Reset from the reset signal terminal RESET, the first voltage signal Vgh from the first voltage signal terminal VGH to the second node N2.

For example, as shown in FIGS. 6, 9 and 10, the reset circuit 5 includes a twenty-second transistor T22. A control electrode of the twenty-second transistor T22 is coupled to the reset signal terminal RESET, a first electrode of the twenty-second transistor T22 is coupled to the first voltage signal terminal VGH, and a second electrode of the twenty-second transistor T22 is coupled to the second node N2.

Based on this, before the shift register RS is charged, that is, before a voltage of the input signal Input of the signal input terminal INPUT changes to a low voltage, the reset circuit 5 may be turned on under control of the reset signal Reset from the reset signal terminal RESET to transmit the first voltage signal Vgh from the first voltage signal terminal VGH to the second node N2, so that the voltage at the second node N2 is reset, which may prevent a large current during startup.

For example, in a reset phase S1 (referring to FIG. 13), the reset circuit 5 may be turned on under control of the low voltage of the reset signal Reset from the reset signal terminal RESET to transmit the first voltage signal Vgh from the first voltage signal terminal VGH to the second node N2, so that the voltage at the second node N2 is approximately equal to the voltage of the first voltage signal Vgh from the first voltage signal terminal VGH.

In some embodiments, as shown in FIGS. 6, 7 and 9, the first control circuit 2 includes a first-level control sub-circuit 21 and a second-level control sub-circuit 22.

The first-level control sub-circuit 21 is coupled to the first node N1, the second node N2, the first voltage signal terminal VGH, the second voltage signal terminal VGL and a fourth node N4. The first-level control sub-circuit 21 is configured to transmit, under control of the voltage at the first node N1, the first voltage signal Vgh from the first voltage signal terminal VGH to the second node N2, or the second voltage signal Vgl from the second voltage signal terminal VGL to the fourth node N4.

Figure 8:
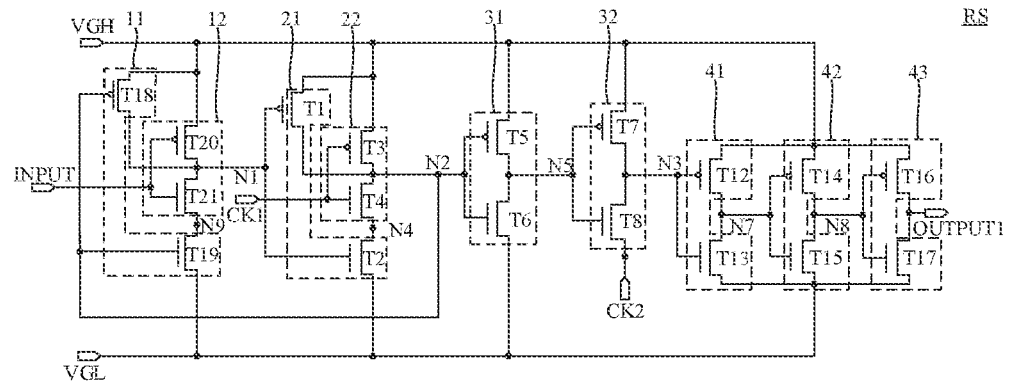
FIG. 8 is a circuit structure diagram of a shift register, in accordance with some embodiments.

For example, as shown in FIGS. 8 and 10, the first-level control sub-circuit 21 includes a first transistor T1 and a second transistor T2. A control electrode of the first transistor T1 is coupled to the first node N1, a first electrode of the first transistor T1 is coupled to the first voltage signal terminal VGH, and a second electrode of the first transistor T1 is coupled to the second node N2. A control electrode of the second transistor T2 is coupled to the first node N1, a first electrode of the second transistor T2 is coupled to the second voltage signal terminal VGL, and a second electrode of the second transistor T2 is coupled to the fourth node N4.

The second-level control sub-circuit 22 is coupled to the first clock signal terminal CK1, the second node N2, the first voltage signal terminal VGH, and the fourth node N4. The second-level control sub-circuit 22 is configured to transmit, under control of the first clock signal Ck1 from the first clock signal terminal CK1, a voltage at the fourth node N4 or the first voltage signal Vgh from the first voltage signal terminal VGH to the second node N2.

For example, as shown in FIGS. 8 and 10, the second-level control sub-circuit 22 includes a third transistor T3 and a fourth transistor T4. A control electrode of the third transistor T3 is coupled to the first clock signal terminal CK1, a first electrode of the third transistor T3 is coupled to the first voltage signal terminal VGH, and a second electrode of the third transistor T3 is coupled to the second node N2. A control electrode of the fourth transistor T4 is coupled to the first clock signal terminal CK1, a first electrode of the fourth transistor T4 is coupled to the fourth node N4, and a second electrode of the fourth transistor T4 is coupled to the second node N2.

In the charging phase S2 (referring to FIG. 13), the input circuit 1 is turned on under the control of the low voltage of the input signal Input from the signal input terminal INPUT to transmit the first voltage signal Vgh from the first voltage signal terminal VGH to the first node N1, so that the first node N1 is at the high voltage; the first-level control sub-circuit 21 transmits, under control of the high voltage of the first node N1, the second voltage signal Vgl from the second voltage signal terminal VGL to the fourth node N4; and the second-level control sub-circuit 22 transmits, under control of the high voltage of the first clock signal Ck1 from the first clock signal terminal CK1, the voltage at the fourth node N4 to the second node N2, so that the second node N2 is at the low voltage.

In the outputting phase S3 (referring to FIG. 13), the input circuit 1 is turned on under the control of the low voltage at the second node N2 to transmit the first voltage signal Vgh from the first voltage signal terminal VGH to the first node N1, so that the first node N1 is at the high voltage; the first-level control sub-circuit 21 transmits, under control of the high voltage at the first node N1, the second voltage signal Vgl from the second voltage signal terminal VGL to the fourth node N4; and the second-level control sub-circuit 22 transmits, under control of the high voltage of the first clock signal Ck1 from the first clock signal terminal CK1, the voltage at the fourth node N4 to the second node N2, so that the second node N2 is at the low voltage.

It will be seen from the above that in the charging phase S2 and the outputting phase S3 (referring to FIG. 13), the first node N1 is continuously stabilized at the high voltage and the second node N2 is continuously stabilized at the low voltage due to action of the first-level control sub-circuit 21 and the second-level control sub-circuit 22. That is, in a frame including the outputting phase S3, a duration for which the first node N1 is at the high voltage and a duration for which the second node N2 is at the low voltage are both approximately twice a pulse width of the input signal Input from the signal input terminal INPUT. In this way, it may be designed that the output cascade signal is output in the outputting phase S3, so as to provide the input signal Input for another shift register RS.

In some embodiments, as shown in FIGS. 6, 7 and 8, the second control circuit 3 includes a third-level control sub-circuit 31 and a fourth-level control sub-circuit 32.

The third-level control sub-circuit 31 is coupled to the second node N2, the first voltage signal terminal VGH, the second voltage signal terminal VGL and a fifth node N5. The third-level control sub-circuit 31 is configured to transmit, under control of the voltage at the second node N2, the first voltage signal Vgh from the first voltage signal terminal VGH or the second voltage signal Vgl from the second voltage signal terminal VGL to the fifth node N5.

For example, as shown in FIGS. 7 and 8, the third-level control sub-circuit 31 includes a fifth transistor T5 and a sixth transistor T6. A control electrode of the fifth transistor T5 is coupled to the second node N2, a first electrode of the fifth transistor T5 is coupled to the first voltage signal terminal VGH, and a second electrode of the fifth transistor T5 is coupled to the fifth node N5. A control electrode of the sixth transistor T6 is coupled to the second node N2, a first electrode of the sixth transistor T6 is coupled to the second voltage signal terminal VGL, and a second electrode of the sixth transistor T6 is coupled to the fifth node N5.

The fourth-level control sub-circuit 32 is coupled to the fifth node N5, the first voltage signal terminal VGH, the second clock signal terminal CK2 and the third node N3. The fourth-level control sub-circuit is configured to transmit, under control of a voltage at the fifth node N5, the first voltage signal Vgh from the first voltage signal terminal VGH or the second clock signal Ck2 from the second clock signal terminal CK2 to the third node N3.

For example, as shown in FIGS. 7 and 8, the fourth-level control sub-circuit 32 includes a seventh transistor T7 and an eighth transistor T8. A control electrode of the seventh transistor T7 is coupled to the fifth node N5, a first electrode of the seventh transistor T7 is coupled to the first voltage signal terminal VGH, and a second electrode of the seventh transistor T7 is coupled to the third node N3. A control electrode of the eighth transistor T8 is coupled to the fifth node N5, a first electrode of the eighth transistor T8 is coupled to the second clock signal terminal CK2, and a second electrode of the eighth transistor T8 is coupled to the third node N3.

In the charging phase S2 (referring to FIG. 13), the third-level control sub-circuit 31 is turned on under control of the low voltage at the second node N2 to transmit the first voltage signal Vgh from the first voltage signal terminal VGH to the fifth node N5, so that the fifth node N5 is at the high voltage; and the fourth-level control sub-circuit 32 transmits, under control of the high voltage at the fifth node N5, the high voltage of the second clock signal Ck2 from the second clock signal terminal CK2 to the third node N3, so that the third node N3 is at the high voltage.

In the outputting phase S3 (referring to FIG. 13), the third-level control sub-circuit 31 is turned on under control of the low voltage at the second node N2 to transmit the first voltage signal Vgh from the first voltage signal terminal VGH to the fifth node N5, so that the fifth node N5 is at the high voltage; and the fourth-level control sub-circuit 32 transmits, under control of the high voltage at the fifth node N5, the low voltage of the second clock signal Ck2 from the second clock signal terminal CK2 to the third node N3, so that the third node N3 is at a low voltage.

It will be seen from the above that in the charging phase S2 and the outputting phase S3 (referring to FIG. 13), the second node N2 is continuously stabilized at the low voltage, so that the third-level control sub-circuit 31 continuously transmits the first voltage signal Vgh from the first voltage signal terminal VGH to the fifth node N5 under control of the low voltage at the second node N2, and the fifth node N5 is continuously stabilized at the high voltage; and the fourth-level control sub-circuit 32 continuously transmits the second clock signal Ck2 from the second clock signal terminal CK2 to the third node N3 under control of the high voltage at the fifth node N5. That is, the voltage at the third node N3 varies depending on the voltage of the second clock signal Ck2 from the second clock signal terminal CK2. In this way, in the outputting phase S3, the low voltage of the second clock signal Ck2 from the second clock signal terminal CK2 may be output as the cascade signal, so as to provide the input signal Input for the another shift register RS.

In some embodiments, as shown in FIGS. 6, 9, and 10, the second control circuit 3 further includes a fifth-level control sub-circuit 33. The fifth-level control sub-circuit 33 is coupled to the fifth node N5, the first voltage signal terminal VGH, the second voltage signal terminal VGL, the second clock signal terminal CK2, and the third node N3. The fifth-level control sub-circuit 33 is configured to transmit, under control of the voltage at the fifth node N5, the second clock signal Ck2 from the second clock signal terminal CK2 to the third node N3.

For example, as shown in FIGS. 9 and 10, the fifth-level control sub-circuit 33 includes a ninth transistor T9, a tenth transistor T10 and an eleventh transistor T11. A control electrode of the ninth transistor T9 is coupled to the fifth node N5, a first electrode of the ninth transistor T9 is coupled to the first voltage signal terminal VGH, and a second electrode of the ninth transistor T9 is coupled to a sixth node N6. A control electrode of the tenth transistor T10 is coupled to the fifth node N5, a first electrode of the tenth transistor T10 is coupled to the second voltage signal terminal VGL, and a second electrode of the tenth transistor T10 is coupled to the sixth node N6. A control electrode of the eleventh transistor T11 is coupled to the sixth node N6, a first electrode of the eleventh transistor T11 is coupled to the second clock signal terminal CK2, and a second electrode of the eleventh transistor T11 is coupled to the third node N3.

In the charging phase S2 (referring to FIG. 13), the fifth-level control sub-circuit 33 is turned on under the control of the high voltage at the fifth node N5 to transmit the second clock signal Ck2 from the second clock signal terminal CK2 to the third node N3.

In the outputting phase S3 (referring to FIG. 13), the fifth-level control sub-circuit 33 is turned on under the control of the high voltage at the fifth node N5 to transmit the second clock signal Ck2 from the second clock signal terminal CK2 to the third node N3.

It will be seen from the above that in the charging phase S2 and the outputting phase S3 (referring to FIG. 13), the fifth-level control sub-circuit 33 continuously transmits the second clock signal Ck2 from the second clock signal terminal CK2 to the third node N3 under the control of the high voltage at the fifth node N5. That is, the fifth-level control sub-circuit 33 and the fourth-level control sub-circuit 32 are connected in parallel. In this way, it is conducive to a rapid response of the voltage at the third node N3 to variation of the voltage of the second clock signal Ck2 from the second clock signal terminal CK2.

Figure 11:
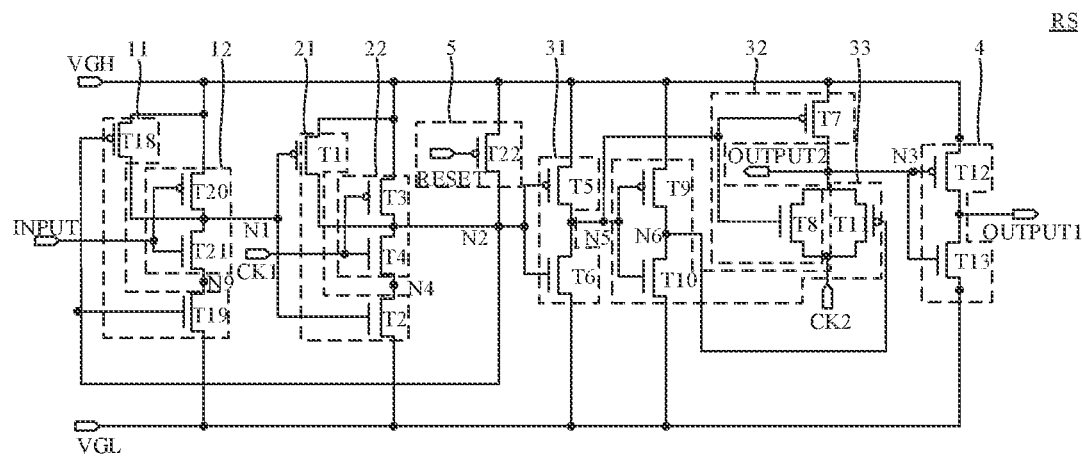
FIG. 11 is a circuit structure diagram of yet another shift register, in accordance with some embodiments.

In some embodiments, as shown in FIGS. 6 and 11, the output circuit 4 includes a twelfth transistor T12 and a thirteenth transistor T13. A control electrode of the twelfth transistor T12 is coupled to the third node N3, a first electrode of the twelfth transistor T12 is coupled to the first voltage signal terminal VGH, and a second electrode of the twelfth transistor T12 is coupled to the scan signal output terminal OUTPUT1. A control electrode of the thirteenth transistor T13 is coupled to the third node N3, a first electrode of the thirteenth transistor T13 is coupled to the second voltage signal terminal VGL, and a second electrode of the thirteenth transistor T13 is coupled to the scan signal output terminal OUTPUT1.

In the outputting phase S3 (referring to FIG. 13), the twelfth transistor T12 transmits the first voltage signal Vgh from the first voltage signal terminal VGH to the scan signal output terminal OUTPUT1 under control of the low voltage at the third node N3.

In the denoising phase S4 (referring to FIG. 13), the thirteenth transistor T13 is turned on under control of the high voltage at the third node N3 to transmit the second voltage signal Vgl from the second voltage signal terminal VGL to the scan signal output terminal OUTPUT1, so as to perform the denoising processing on the scan signal output terminal OUTPUT1.

In some other embodiments, as shown in FIGS. 6, 9, and 10, the output circuit 4 includes an odd number of output sub-circuits that are connected in series. A first output sub-circuit is coupled to the third node N3, and a last output sub-circuit is coupled to the scan signal output terminal OUTPUT1.

The first output sub-circuit is configured to transmit, under the control of the voltage at the third node N3, the first voltage signal Vgh from the first voltage signal terminal VGH or the second voltage signal Vgl from the second voltage signal terminal VGL to a next output sub-circuit adjacent thereto.

The last output sub-circuit is configured to transmit, under control of a signal output by a previous output sub-circuit adjacent thereto, the first voltage signal Vgh from the first voltage signal terminal VGH or the second voltage signal Vgl from the second voltage signal terminal VGL to the scan signal output terminal OUTPUT1.

Other output sub-circuits except the first and last output sub-circuits in the odd number of output sub-circuits are each configured to transmit, under control of a signal output by a previous output sub-circuit adjacent thereto, the first voltage signal Vgh from the first voltage signal terminal VGH or the second voltage signal Vgl from the second voltage signal terminal VGL to a next output sub-circuit adjacent thereto.

In order to improve of an output capability of the shift register RS, for example, as shown in FIGS. 6, 9, and 10, the output circuit 4 includes the first output sub-circuit 41, a second output sub-circuit 42, and a third output sub-circuit 43.

The first output sub-circuit 41 is coupled to the third node N3, the first voltage signal terminal VGH, the second voltage signal terminal VGL, and a seventh node N7. The first output sub-circuit 41 is configured to transmit, under the control of the voltage at the third node N3, the first voltage signal Vgh from the first voltage signal terminal VGH or the second voltage signal Vgl from the second voltage signal terminal VGL to the seventh node N7.

For example, as shown in FIGS. 9 and 10, the first output sub-circuit 41 includes a twelfth transistor T12 and a thirteenth transistor T13. A control electrode of the twelfth transistor T12 is coupled to the third node N3, a first electrode of the twelfth transistor T12 is coupled to the first voltage signal terminal VGH, and a second electrode of the twelfth transistor T12 is coupled to the seventh node N7. A control electrode of the thirteenth transistor T13 is coupled to the third node N3, a first electrode of the thirteenth transistor T13 is coupled to the second voltage signal terminal VGL, and a second electrode of the thirteenth transistor T13 is coupled to the seventh node N7.

The second output sub-circuit 42 is coupled to the seventh node N7, the first voltage signal terminal VGH, the second voltage signal terminal VGL, and an eighth node N8. The second output sub-circuit 42 is configured to transmit, under control of a voltage at the seventh node N7, the first voltage signal Vgh from the first voltage signal terminal VGH or the second voltage signal Vgl from the second voltage signal terminal VGL to the eighth node N8.

For example, as shown in FIGS. 9 and 10, the second output sub-circuit 42 includes a fourteenth transistor T14 and a fifteenth transistor T15. A control electrode of the fourteenth transistor T14 is coupled to the seventh node N7, a first electrode of the fourteenth transistor T14 is coupled to the first voltage signal terminal VGH, and a second electrode of the fourteenth transistor T14 is coupled to the eighth node N8. A control electrode of the fifteenth transistor T15 is coupled to the seventh node N7, a first electrode of the fifteenth transistor T15 is coupled to the second voltage signal terminal VGL, and a second electrode of the fifteenth transistor T15 is coupled to the eighth node N8.

The third output sub-circuit 43 is coupled to the eighth node N8, the first voltage signal terminal VGH, the second voltage signal terminal VGL, and the scan signal output terminal OUTPUT1. The third output sub-circuit 43 is configured to transmit, under control of a voltage at the eighth node N8, the first voltage signal Vgh from the first voltage signal terminal VGH or the second voltage signal Vgl from the second voltage signal terminal VGL to the scan signal output terminal OUTPUT1.

For example, as shown in FIGS. 9 and 10, the third output sub-circuit 43 includes a sixteenth transistor T16 and a seventeenth transistor T17. A control electrode of the sixteenth transistor T16 is coupled to the eighth node N8, a first electrode of the sixteenth transistor T16 is coupled to the first voltage signal terminal VGH, and a second electrode of the sixteenth transistor T16 is coupled to the scan signal output terminal OUTPUT1. A control electrode of the seventeenth transistor T17 is coupled to the eighth node N8, a first electrode of the seventeenth transistor T17 is coupled to the second voltage signal terminal VGL, and a second electrode of the seventeenth transistor T17 is coupled to the scan signal output terminal OUTPUT1.

In the outputting phase S3 (referring to FIG. 13), the first output sub-circuit 41 transmits, under control of the low voltage at the third node N3, the first voltage signal Vgh from the first voltage signal terminal VGH to the seventh node N7; the second output sub-circuit 42 transmits, under control of the high voltage at the seventh node N7, the second voltage signal Vgl from the second voltage signal terminal VGL to the eighth node N8; and the third output sub-circuit 43 transmits, under control of the low voltage at the eighth node N8, the first voltage signal Vgh from the first voltage signal terminal VGH to the scan signal output terminal OUTPUT1.

Here, three levels of output sub-circuits are used, so that a gate of a transistor in the last output sub-circuit may be controlled by a signal output by a stabilized signal terminal, and the output is relatively stable. In addition, the three levels of output sub-circuits are used to improve the output capability of the output sub-circuits in a stepwise manner, so that the scan signal that meets the driving requirements of the pixel driving circuit may be output by using transistors with relatively small width-to-length ratios.

In some embodiments, as shown in FIGS. 7 and 9, the input circuit 1 includes a first initialization sub-circuit 11 and a second initialization sub-circuit 12.

The first initialization sub-circuit 11 is coupled to the first node N1, the second node N2, the first voltage signal terminal VGH, the second voltage signal terminal VGL and a ninth node N9. The first initialization sub-circuit 11 is configured to transmit, under the control of the voltage at the second node N2, the first voltage signal Vgh from the first voltage signal terminal VGH to the first node N1, or the second voltage signal Vgl from the second voltage signal terminal VGL to the ninth node N9.

For example, as shown in FIGS. 7 to 11, the first initialization sub-circuit 11 includes an eighteenth transistor T18 and a nineteenth transistor T19. A control electrode of the eighteenth transistor T18 is coupled to the second node N2, a first electrode of the eighteenth transistor T18 is coupled to the first voltage signal terminal VGH, and a second electrode of the eighteenth transistor T18 is coupled to the first node N1. A control electrode of the nineteenth transistor T19 is coupled to the second node N2, a first electrode of the nineteenth transistor T19 is coupled to the second voltage signal terminal VGL, and a second electrode of the nineteenth transistor T19 is coupled to the ninth node N9.

The second initialization sub-circuit 12 is coupled to the signal input terminal INPUT, the first node N1, the first voltage signal terminal VGH, the second voltage signal terminal VGL, and the ninth node N9. The second initialization sub-circuit 12 is configured to transmit, under the control of the input signal Input from the signal input terminal INPUT, the first voltage signal Vgh from the first voltage signal terminal VGH or a voltage at the ninth node N9 to the first node N1.

For example, as shown in FIGS. 7 and 9, the second initialization sub-circuit 12 includes a twentieth transistor T20 and a twenty-first transistor T21. A control electrode of the twentieth transistor T20 is coupled to the signal input terminal INPUT, a first electrode of the twentieth transistor T20 is coupled to the first voltage signal terminal VGH, and a second electrode of the twentieth transistor T20 is coupled to the first node N1; and a control electrode of the twenty-first transistor T21 is coupled to the signal input terminal INPUT, a first electrode of the twenty-first transistor T21 is coupled to the ninth node N9, and a second electrode of the twenty-first transistor T21 is coupled to the first node N1.

In the charging phase S2 (referring to FIG. 13), the second initialization sub-circuit 12 is turned on under the control of the low voltage of the input signal Input from the signal input terminal INPUT to transmit the first voltage signal Vgh from the first voltage signal terminal VGH to the first node N1, so that the first node N1 is at the high voltage.

In the outputting phase S3 (referring to FIG. 13), the second initialization sub-circuit 12 transmits, under the control of the voltage at the second node N2, the first voltage signal Vgh from the first voltage signal terminal VGH to the first node N1, so that the first node N1 is at the high voltage.

It will be seen from the above that in the charging phase S2 and the outputting phase S3 (referring to FIG. 13), the first node N1 may be continuously stabilized at the high voltage.

In the shift register in the embodiments of the present disclosure, the output circuit of the shift register RS includes the odd number of output sub-circuits, and each output sub-circuit includes a P-type transistor and an N-type transistor.

In the shift register in the embodiments of the present disclosure, the first transistor T1, the third transistor T3, the fifth transistor T5, the seventh transistor T7, the ninth transistor T9, the eleventh transistor T11, the twelfth transistor T12, the fourteenth transistor T14, the sixteenth transistor T16, the eighteenth transistor T18, the twentieth transistor T20 and the twenty-second transistor T22 are all P-type transistors; and the second transistor T2, the fourth transistor T4, the sixth transistor T6, the eighth transistor T8, the tenth transistor T10, the thirteenth transistor T13, the fifteenth transistor T15, the seventeenth transistor T17, the nineteenth transistor T19 and the twenty-first transistor T21 are all N-type transistors.

Figure 13:
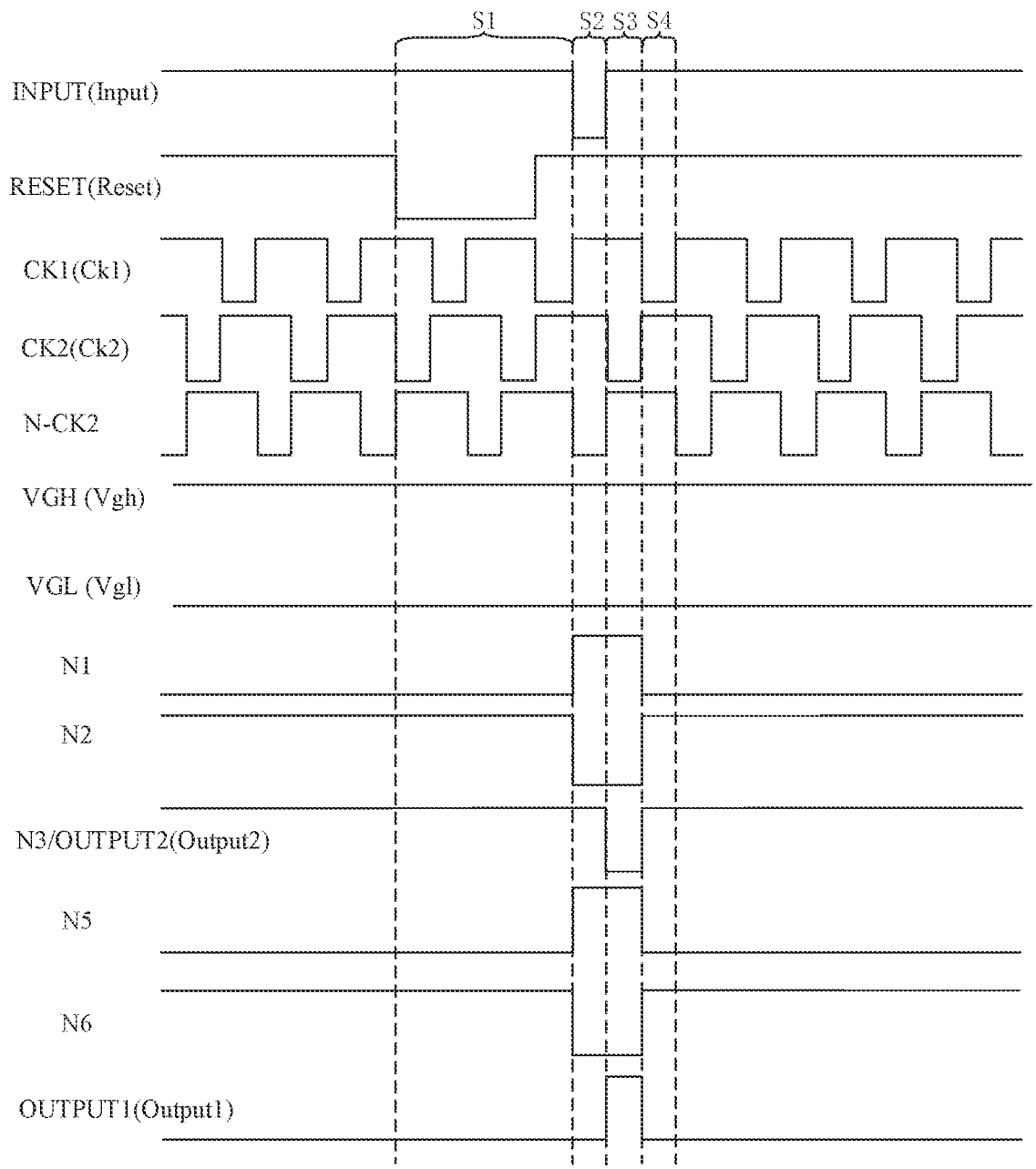
FIG. 13 is a driving timing diagram of a shift register, in accordance with some embodiments.

Some embodiments of the present disclosure further provide a driving method for a shift register RS, and the driving method is applied to the shift register RS in any of the above embodiments. As shown in FIG. 13, a frame period includes a charging phase S2 and an outputting phase S3, and the driving method for the shift register includes the following.

In the charging phase S2, the input circuit 1 transmits, under the control of the low voltage of the input signal Input of the signal input terminal INPUT, the first voltage signal Vgh from the first voltage signal terminal VGH to the first node N1; the first control circuit 2 transmits, under the control of the high voltage of the first clock signal Ck1 from the first clock signal terminal CK1 and the high voltage at the first node N1, the second voltage signal Vgl from the second voltage signal terminal VGL to the second node N2; the second control circuit 3 transmits, under the control of the low voltage at the second node N2, the high voltage of the second clock signal Ck2 from the second clock signal terminal CK2 to the third node N3; and the output circuit 4 transmits, under the control of the high voltage at the third node N3, the second voltage signal Vgl from the second voltage signal terminal VGL to the scan signal output terminal OUTPUT1.

In the outputting phase S3, the input circuit 1 transmits, under the control of the low voltage at the second node N2, the first voltage signal Vgh from the first voltage signal terminal VGH to the first node N1; the first control circuit 2 transmits, under the control of the high voltage of the first clock signal Ck1 from the first clock signal terminal CK1 and the high voltage at the first node N1, the second voltage signal from the second voltage signal terminal VGL to the second node N2; the second control circuit 3 transmits, under the control of the low voltage at the second node N2, the low voltage of the second clock signal Ck2 from the second clock signal terminal CK2 to the third node N3; and the output circuit 4 transmits, under the control of the low voltage at the third node N3, the first voltage signal Vgh from the first voltage signal terminal VGH to the scan signal output terminal OUTPUT1.

In some embodiments, as shown in FIG. 13, the frame period further includes a denoising phase S4, and the driving method for the shift register further includes the following.

In the denoising phase S4, the input circuit 1 transmits, under the control of the high voltage of the input signal Input from the signal input terminal INPUT and the high voltage at the second node N2, the second voltage signal Vgl from the second voltage signal terminal VGL to the first node N1; the first control circuit 2 transmits, under the control of the low voltage of the first clock signal Ck1 from the first clock signal terminal CK1 and the low voltage at the first node N1, the first voltage signal Vgh from the first voltage signal terminal VGH to the second node N2; the second control circuit 3 transmits, under the control of the high voltage at the second node N2, the first voltage signal Vgh from the first voltage signal terminal VGH to the third node N3; and the output circuit 4 transmits, under the control of the high voltage at the third node, the second voltage signal Vgl from the second voltage signal terminal VGL to the scan signal output terminal OUTPUT1.

In some embodiments, as shown in FIG. 13, the frame period further includes a reset phase S1, and the driving method for the shift register further includes the following.

In the reset phase S1, the reset circuit 5 transmits, under the control of the reset signal Reset from the reset signal terminal RESET, the first voltage signal Vgh from the first voltage signal terminal VGH to the second node N2; the input circuit 1 transmits, under the control of the high voltage of the input signal Input from the signal input terminal INPUT and the high voltage at the second node N2, the second voltage signal Vgl from the second voltage signal terminal VGL to the first node N1; and the first control circuit 2 transmits, under the control of the low voltage at the first node N1, the first voltage signal Vgh from the first voltage signal terminal VGH to the second node N2.

An operating process of the shift register RS shown in FIG. 10 in a process of driving a gate line will be described in detail below. The following description will be made by considering an example in which the first transistor T1, the third transistor T3, the fifth transistor T5, the seventh transistor T7, the ninth transistor T9, the eleventh transistor T11, the twelfth transistor T12, the fourteenth transistor T14, the sixteenth transistor T16, the eighteenth transistor T18, the twentieth transistor T20 and the twenty-second transistor T22 are all P-type transistors (regardless of an influence of threshold voltages of the transistors); the second transistor T2, the fourth transistor T4, the sixth transistor T6, the eighth transistor T8, the tenth transistor T10, the thirteenth transistor T13, the fifteenth transistor T15, the seventeenth transistor T17, the nineteenth transistor T19 and the twenty-first transistor T21 are all N-type transistors (regardless of an influence of threshold voltages of the transistors); the voltage transmitted by the first voltage signal terminal VGL is the low voltage, and the voltage transmitted by the second voltage signal terminal VGH is the high voltage.

The "low voltage" can make the P-type transistors turned on, but cannot make the N-type transistors turned on (i.e., make the N-type transistors turned off). The "high voltage" can make the N-type transistors turned on, but cannot make the N-type transistors turned on (i.e., make the P-type transistors turned off).

For example, in the following description, "0" represents the low voltage, and "1" represents the high voltage.

In the reset phase S1, referring to FIGS. 10 and 13, RESET is set to be 0 (RESET=0).

In this case, the twenty-second transistor T22 is turned on under the control of the low voltage of the reset signal Reset from the reset signal terminal RESET to transmit the first voltage signal Vgh from the first voltage signal terminal VGH to the second node N2, so that the second node N2 is at the high voltage.

The nineteenth transistor T19 is turned on under the control of the high voltage at the second node N2 to transmit the second voltage signal Vgl from the second voltage signal terminal VGL to the ninth node N9, so that the ninth node N9 is at the low voltage; and the twenty-first transistor T21 is turned on under the control of the high voltage of the input signal Input from the signal input terminal INPUT to transmit the low voltage at the ninth node N9 to the first node N1, so that the voltage at the first node N1 is the low voltage.

The first transistor T1 is turned on under the control of the low voltage at the first node N1 to transmit the first voltage signal Vgh from the first voltage signal terminal VGH to the second node N2, so that the voltage at the second node N2 is the high voltage.

It will be noted that the reset phase S1 in FIG. 13 includes a phase in which RESET is set to be 1 (RESET=1). In this phrase, the twenty-second transistor T22 is turned off, the voltage at the second node N2 has been reset, and the voltage at the second node N2 in this phase is still the voltage of the first voltage signal Vgh (i.e., the high voltage) transmitted by the first voltage signal terminal VGH.

In the charging phase S2, referring to FIGS. 10 and 13, INPUT is set to be 0 (INPUT=0), RESET is set to be 1 (RESET=1), CK1 is set to be 1 (CK1=1), and CK2 is set to be 1 (CK2=1).

In this case, the twenty-second transistor T22 is turned off under the control of the high voltage of the reset signal Reset from the reset signal terminal RESET, so that it is ensured that the voltage at the second node N2 is free from the reset signal Reset in the charging phase S2.

The twentieth transistor T20 is turned on under the control of the low voltage of the input signal Input from the signal input terminal INPUT to transmit the first voltage signal Vgh from the first voltage signal terminal VGH to the first node N1, so that the first node N1 is at the high voltage.

The second transistor T2 is turned on under the control of the high voltage at the first node N1 to transmit the second voltage signal Vgl from the second voltage signal terminal VGL to the fourth node N4, so that the fourth node N4 is at the low voltage.

The fourth transistor T4 is turned on under the control of the high voltage of the first clock signal Ck1 from the first clock signal terminal CK1 to transmit the low voltage at the fourth node N4 to the second node N2, so that the second node N2 is at the low voltage.

The fifth transistor T5 is turned on under the control of the low voltage at the second node N2 to transmit the first voltage signal Vgh from the first voltage signal terminal VGH to the fifth node N5, so that the fifth node N5 is at the high voltage.

The eighth transistor T8 is turned on under the control of the high voltage at the fifth node N5 to transmit the high voltage of the second clock signal Ck2 from the second clock signal terminal CK2 to the third node N3 and the cascade signal output terminal OUTPUT2.

The tenth transistor T10 is turned on under the control of the high voltage at the fifth node N5 to transmit the second voltage signal Vgl from the second voltage signal terminal VGL to the sixth node N6, so that the sixth node N6 is at the low voltage; and the eleventh transistor T11 is turned on under the control of the low voltage at the sixth node N6 to transmit the high voltage of the second clock signal Ck2 from the second clock signal terminal CK2 to the third node N3 and the cascade signal output terminal OUTPUT2.

The thirteenth transistor T13 is turned on under the control of the high voltage at the third node N3 to transmit the second voltage signal Vgl from the second voltage signal terminal VGL to the seventh node N7, so that the seventh node N7 is at the low voltage.

The fourteenth transistor T14 is turned on under the control of the low voltage of the seventh node N7 to transmit the first voltage signal Vgh from the first voltage signal terminal VGH to the eighth node N8, so that the eighth node N8 is at the high voltage.

The seventeenth transistor T17 is turned on under the control of the high voltage at the eighth node N8 to transmit the second voltage signal Vgl from the second voltage signal terminal VGL to the scan signal terminal OUTPUT1, so as to perform denoising on the scan signal output terminal OUTPUT1 continuously.

In the outputting phase S3, referring to FIGS. 10 and 13, INPUT is set to be 1 (INPUT=1), RESET is set to be 1 (RESET=1), CK1 is set to be 1 (CK1=1), and CK2 is set to be 0 (CK2=0).

In this case, the twenty-second transistor T22 is turned off under the control of the high voltage of the reset signal Reset from the reset signal terminal RESET, so that it is ensured that the voltage at the second node N2 is free from the reset signal Reset in the outputting phase S3.

The eighteenth transistor T18 is turned on under the control of the low voltage at the second node N2 to transmit the first voltage signal Vgh from the first voltage signal terminal VGH to the first node N1, so that the first node N1 is at the high voltage.

The second transistor T2 is turned on under the control of the high voltage at the first node N1 to transmit the second voltage signal Vgl from the second voltage signal terminal VGL to the fourth node N4, so that the fourth node N4 is at the low voltage.

The fourth transistor T4 is turned on under the control of the high voltage of the first clock signal Ck1 of the first clock signal terminal CK1 to transmit the low voltage at the fourth node N4 to the second node N2, so that the second node N2 is at the low voltage.

The fifth transistor T5 is turned on under the control of the low voltage at the second node N2 to transmit the first voltage signal Vgh from the first voltage signal terminal VGH to the fifth node N5, so that the fifth node N5 is at the high voltage.

The eighth transistor T8 is turned on under the control of the high voltage at the fifth node N5 to transmit the low voltage of the second clock signal Ck2 from the second clock signal terminal CK2 to the third node N3 and the cascade signal output terminal OUTPUT2.

The tenth transistor T10 is turned on under the control of the high voltage at the fifth node N5 to transmit the second voltage signal Vgl from the second voltage signal terminal VGL to the sixth node N6, so that the sixth node N6 is at the low voltage; and the eleventh transistor T11 is turned on under the control of the low voltage at the sixth node N6 to transmit the low voltage of the second clock signal Ck2 from the second clock signal terminal CK2 to the third node N3 and the cascade signal output terminal OUTPUT2.

The twelfth transistor T12 is turned on under the control of the low voltage at the third node N3 to transmit the first voltage signal Vgh from the first voltage signal terminal VGH to the seventh node N7, so that the seventh node N7 is at the high voltage.

The fifteenth transistor T15 is turned on under the control of the high voltage at the seventh node N7 to transmit the second voltage signal Vgl from the second voltage signal terminal VGL to the eighth node N8, so that the eighth node N8 is at the low voltage.

The sixteenth transistor T16 is turned on under the control of the low voltage at the eighth node N8 to transmit the first voltage signal Vgh from the first voltage signal terminal VGH to the scan signal terminal OUTPUT1, so as to output the scan signal.

In the denoising phase S4, referring to FIGS. 10 and 13, INPUT is set to be 1 (INPUT=1), RESET is set to be 1 (RESET=1), CK1 is set to be 0 (CK1=0), and CK2 is set to be 1 (CK2=1).

In this case, the twenty-second transistor T22 is turned off under the control of the high voltage of the reset signal Reset from the reset signal terminal RESET, so that it is ensured that the voltage at the second node N2 is free from the reset signal Reset in the denoising phase S4.

The third transistor T3 is turned on under the control of the low voltage of the first clock signal Ck1 from the first clock signal terminal CK1 to transmit the first voltage signal Vgh from the first voltage signal terminal VGH to the second node N2, so that the second node N2 is at the high voltage.

The nineteenth transistor T19 is turned on under the control of the high voltage at the second node N2 to transmit the second voltage signal Vgl from the second voltage signal terminal VGL to the ninth node N9, so that the ninth node N9 is at the low voltage.

The twenty-first transistor T21 is turned on under the control of the high voltage of the input signal Input from the signal input terminal INPUT to transmit the low voltage at the ninth node N9 to the first node N1, so that the first node N1 is at the low voltage.

The first transistor T1 is turned on under the control of the low voltage at the first node N1 to transmit the first voltage signal Vgh from the first voltage signal terminal VGH to the second node N2, so that the second node N2 is at the high voltage.

The sixth transistor T6 is turned on under the control of the high voltage at the second node N2 to transmit the second voltage signal Vgl from the second voltage signal terminal VGL to the fifth node N5, so that the fifth node N5 is at the low voltage.

The seventh transistor T7 is turned on under the control of the low voltage at the fifth node N5 to transmit the first voltage signal Vgh from the first voltage signal terminal VGH to the third node N3, so that the third node N3 is at the high voltage.

The ninth transistor T9 is turned on under the control of the low voltage at the fifth node N5 to transmit the first voltage signal Vgh from the first voltage signal terminal VGH to the sixth node N6, so that the sixth node N6 is at the high voltage; and the eleventh transistor T11 is turned off under the control of the high voltage at the sixth node N6.

The thirteenth transistor T13 is turned on under the control of the high voltage at the third node N3 to transmit the second voltage signal Vgl from the second voltage signal terminal VGL to the seventh node N7, so that the seventh node N7 is at the low voltage.

The fourteenth transistor T14 is turned on under the control of the low voltage at the seventh node N7 to transmit the first voltage signal Vgh from the first voltage signal terminal VGH to the eighth node N8, so that the eighth node N8 is at the high voltage.

The seventeenth transistor T17 is turned on under the control of the high voltage at the eighth node N8 to transmit the second voltage signal Vgl from the second voltage signal terminal VGL to the scan signal terminal OUTPUT1, so as to perform denoising on the scan signal terminal OUTPUT1.

Figure 12:
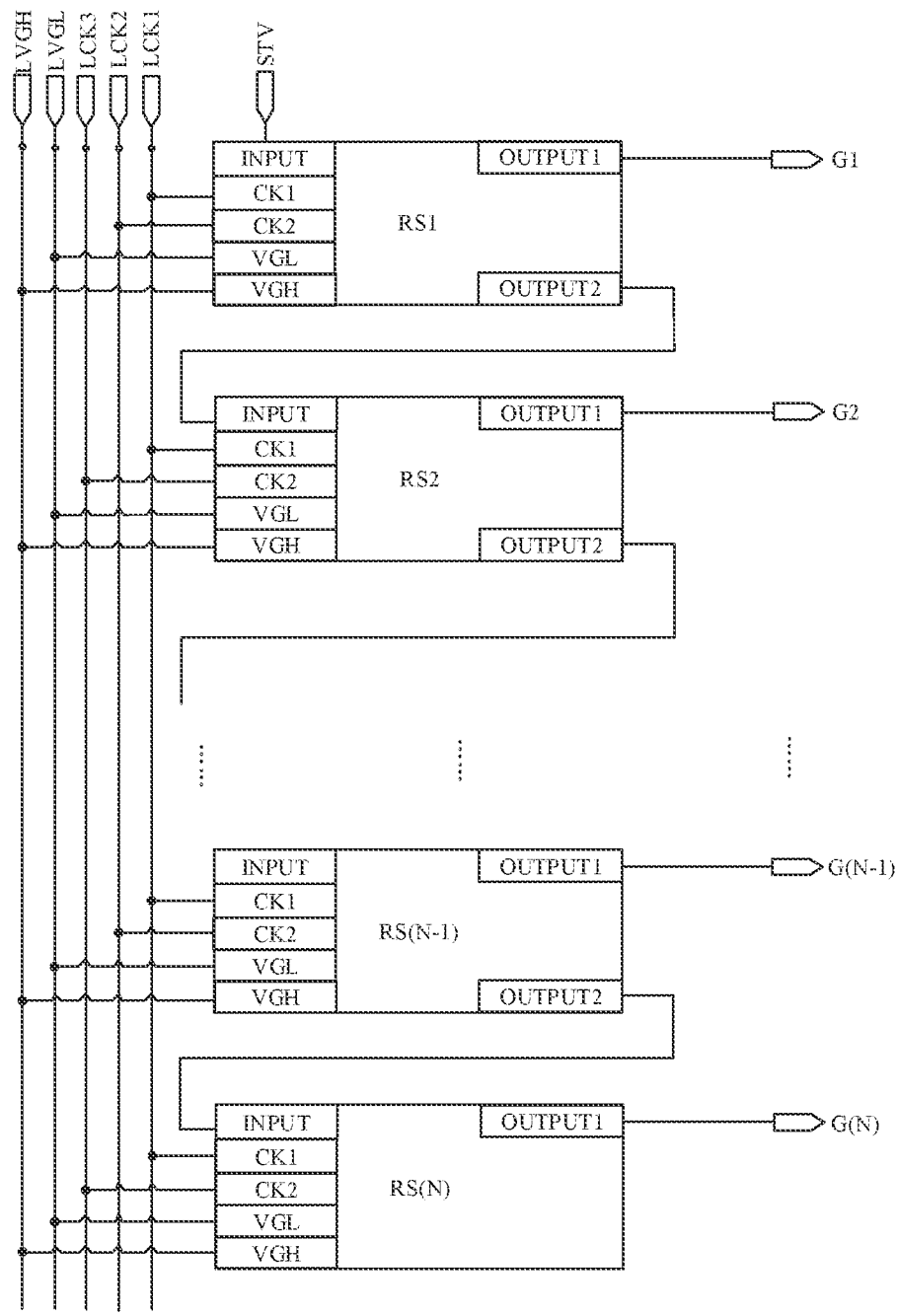
FIG. 12 is a structural diagram of a gate driver circuit, in accordance with some embodiments.

Some embodiments of the present disclosure further provide a gate driver circuit 200. Referring to FIG. 12, the gate driver circuit 200 includes at least two shift registers RS that are cascaded.

In some embodiments, as shown in FIGS. 3 and 12, in the shift registers RS (RS1, RS2, . . . , RS(N)) in the gate driver circuit 200, the scan signal output terminal OUTPUT1 and the cascade signal output terminal OUTPUT2 are disposed separately. The gate scan signal Gate is output to a gate line GL connected to the shift register through the scan signal output terminal OUTPUT1, and the cascade signal is output to the gate line GL connected to the shift register through the cascade signal output terminal OUTPUT2.

For example, in every two adjacent shift registers RS, a signal input terminal INPUT of a latter-stage shift register RS is coupled to the cascade signal output terminal OUTPUT2 of a previous-stage shift register RS, and the signal input terminal INPUT of a first-stage shift register RS1 is coupled to an initialization signal terminal STV.

In some embodiments, the gate driver circuit 200 further includes a first clock signal line LCK1, a second clock signal line LCK2 and a third clock signal line LCK3. The first clock signal line LCK1 is coupled to the first clock signal terminal CK1 of each shift register RS, the second clock signal line LCK2 is coupled to second clock signal terminals CK2 of odd-numbered stages of shift registers RS, and the third clock signal line LCK3 is coupled to second clock signal terminals CK2 of even-numbered stages of shift registers RS.

As shown in FIG. 13, a signal N-CK2 in FIG. 13 is a square wave pulse signal of the second clock signal terminal CK2 of a next-stage shift register RS, and a rising edge of the signal N-CK2 is aligned with a rising edge of the scan signal output terminal OUTPUT1 of a current-stage shift register RS. For example, the second clock signal Ck2 is a square wave pulse signal provided by the second clock signal line LCK2 coupled to the odd-numbered stages of shift registers RS, and the signal N-CK2 is a square wave pulse signal provided by the third clock signal line LCK3 coupled to the even-numbered stages of shift registers RS.

In addition, the gate driver circuit 200 in some embodiments of the present disclosure further includes a first voltage signal line LVGH and a second voltage signal line LVGL. The first voltage signal line LVGH is coupled to the first voltage signal terminal VGH of each shift register RS, and the second voltage signal line LVGL is coupled to the second voltage signal terminal VGL of each shift register RS.

In the embodiments of the present disclosure, cascading manners of various stages of the shift registers RS in the gate driver circuit 200 and the connection manners of the various stages of the shift registers RS and the clock signal lines are not limited thereto.

The forgoing descriptions are merely specific implementation manners of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register, comprising:
an input circuit coupled to a signal input terminal, a first voltage signal terminal and a first node; and the input circuit being configured to transmit, under control of an input signal from the signal input terminal, a first voltage signal from the first voltage signal terminal to the first node;
a first control circuit coupled to the first node, a first clock signal terminal, a second voltage signal terminal and a second node; and the first control circuit being configured to transmit, under control of a first clock signal from the first clock signal terminal and a voltage at the first node, a second voltage signal from the second voltage signal terminal to the second node;
a second control circuit coupled to the second node, a second clock signal terminal and a third node; and the second control circuit being configured to transmit, under control of a voltage at the second node, a second clock signal from the second clock signal terminal to the third node; and
an output circuit coupled to the third node, the first voltage signal terminal and a scan signal output terminal; and the output circuit being configured to transmit, under control of a voltage at the third node, the first voltage signal from the first voltage signal terminal to the scan signal output terminal.

2. The shift register according to claim 1, wherein the input circuit is further coupled to the second voltage signal terminal and the second node; and the input circuit is further configured to transmit, under the control of the input signal from the signal input terminal and the voltage at the second node, the second voltage signal from the second voltage signal terminal to the first node;
the first control circuit is further coupled to the first voltage signal terminal; and the first control circuit is further configured to transmit, under the control of the first clock signal from the first clock signal terminal and the voltage of the first node, the first voltage signal from the first voltage signal terminal to the second node;
the second control circuit is further coupled to the first voltage signal terminal; and the second control circuit is further configured to transmit, under the control of the voltage at the second node, the first voltage signal from the first voltage signal terminal to the third node; and
the output circuit is further coupled to the second voltage signal terminal; and the output circuit is further configured to transmit, under the control of the voltage at the third node, the second voltage signal from the second voltage signal terminal to the scan signal output terminal.

3. The shift register according to claim 2, wherein the first control circuit includes:
a first-level control sub-circuit coupled to the first node, the second node, the first voltage signal terminal, the second voltage signal terminal and a fourth node; and the first-level control sub-circuit being configured to transmit, under the control of the voltage at the first node, the first voltage signal from the first voltage signal terminal to the second node, or the second voltage signal from the second voltage signal terminal to the fourth node; and
a second-level control sub-circuit coupled to the first clock signal terminal, the second node, the first voltage signal terminal and the fourth node; and the second-level control sub-circuit being configured to transmit, under the control of the first clock signal from the first clock signal terminal, a voltage at the fourth node or the first voltage signal from the first voltage signal terminal to the second node.

4. The shift register according to claim 3, wherein the first-level control sub-circuit includes:
a first transistor, a control electrode of the first transistor being coupled to the first node, a first electrode of the first transistor being coupled to the first voltage signal terminal, and a second electrode of the first transistor being coupled to the second node; and
a second transistor, a control electrode of the second transistor being coupled to the first node, a first electrode of the second transistor being coupled to the second voltage signal terminal, and a second electrode of the second transistor being coupled to the fourth node; and
the second-level control sub-circuit includes:
a third transistor, a control electrode of the third transistor being coupled to the first clock signal terminal, a first electrode of the third transistor being coupled to the first voltage signal terminal, and a second electrode of the third transistor being coupled to the second node; and
a fourth transistor, a control electrode of the fourth transistor being coupled to the first clock signal terminal, a first electrode of the fourth transistor being coupled to the fourth node, and a second electrode of the fourth transistor being coupled to the second node.

5. The shift register according to claim 2, wherein the second control circuit includes:
a third-level control sub-circuit coupled to the second node, the first voltage signal terminal, the second voltage signal terminal and a fifth node; and the third-level control sub-circuit being configured to transmit, under the control of the voltage at the second node, the first voltage signal from the first voltage signal terminal or the second voltage signal from the second voltage signal terminal to the fifth node; and
a fourth-level control sub-circuit coupled to the fifth node, the first voltage signal terminal, the second clock signal terminal and the third node; and the fourth-level control sub-circuit being configured to transmit, under control of a voltage at the fifth node, the first voltage signal from the first voltage signal terminal or the second clock signal from the second clock signal terminal to the third node.

6. The shift register according to claim 5, wherein the third-level control sub-circuit includes:
a fifth transistor, a control electrode of the fifth transistor being coupled to the second node, a first electrode of the fifth transistor being coupled to the first voltage signal terminal, and a second electrode of the fifth transistor being coupled to the fifth node; and
a sixth transistor, a control electrode of the sixth transistor being coupled to the second node, a first electrode of the sixth transistor being coupled to the second voltage signal terminal, and a second electrode of the sixth transistor being coupled to the fifth node; and
the fourth-level control sub-circuit includes:
a seventh transistor, a control electrode of the seventh transistor being coupled to the fifth node, a first electrode of the seventh transistor being coupled to the first voltage signal terminal, and a second electrode of the seventh transistor being coupled to the third node; and
an eighth transistor, a control electrode of the eighth transistor being coupled to the fifth node, a first electrode of the eighth transistor being coupled to the second clock signal terminal, and a second electrode of the eighth transistor being coupled to the third node.

7. The shift register according to claim 5, wherein the second control circuit further includes:
a fifth-level control sub-circuit coupled to the fifth node, the first voltage signal terminal, the second voltage signal terminal, the second clock signal terminal and the third node; and the fifth-level control sub-circuit being configured to transmit, under the control of the voltage at the fifth node, the second clock signal from the second clock signal terminal to the third node; or the second control circuit further includes:
the fifth-level control sub-circuit coupled to the fifth node, the first voltage signal terminal, the second voltage signal terminal, the second clock signal terminal and the third node; and the fifth-level control sub-circuit being configured to transmit, under the control of the voltage at the fifth node, the second clock signal from the second clock signal terminal to the third node, wherein the fifth-level control sub-circuit includes:
a ninth transistor, a control electrode of the ninth transistor being coupled to the fifth node, a first electrode of the ninth transistor being coupled to the first voltage signal terminal, and a second electrode of the ninth transistor being coupled to a sixth node;
a tenth transistor, a control electrode of the tenth transistor being coupled to the fifth node, a first electrode of the tenth transistor being coupled to the second voltage signal terminal, and a second electrode of the tenth transistor being coupled to the sixth node; and
an eleventh transistor, a control electrode of the eleventh transistor being coupled to the sixth node, a first electrode of the eleventh transistor being coupled to the second clock signal terminal, and a second electrode of the eleventh transistor being coupled to the third node.

8. The shift register according to claim 2, wherein the third node is further coupled to a cascade signal output terminal, and the cascade signal output terminal is configured to output a cascade signal to another shift register.

9. The shift register according to claim 2, wherein the output circuit includes:
a twelfth transistor, a control electrode of the twelfth transistor being coupled to the third node, a first electrode of the twelfth transistor being coupled to the first voltage signal terminal, and a second electrode of the twelfth transistor being coupled to the scan signal output terminal; and
a thirteenth transistor, a control electrode of the thirteenth transistor being coupled to the third node, a first electrode of the thirteenth transistor being coupled to the second voltage signal terminal, and a second electrode of the thirteenth transistor being coupled to the scan signal output terminal.

10. The shift register according to claim 2, wherein the output circuit includes an odd number of output sub-circuits that are connected in series, a first output sub-circuit is coupled to the third node, and a last output sub-circuit is coupled to the scan signal output terminal;
the first output sub-circuit is configured to transmit, under the control of the voltage at the third node, the first voltage signal from the first voltage signal terminal or the second voltage signal from the second voltage signal terminal to a next output sub-circuit adjacent thereto;
the last output sub-circuit is configured to transmit, under control of a signal output by a previous output sub-circuit adjacent thereto, the first voltage signal from the first voltage signal terminal or the second voltage signal from the second voltage signal terminal to the scan signal output terminal; and
other output sub-circuits except the first output sub-circuit and the last output sub-circuit in the odd number of output sub-circuits are each configured to transmit, under control of a signal output by a previous output sub-circuit adjacent thereto, the first voltage signal from the first voltage signal terminal or the second voltage signal from the second voltage signal terminal to a next output sub-circuit adjacent thereto.

11. The shift register according to claim 10, wherein the odd number of output sub-circuits include:
the first output sub-circuit coupled to the third node, the first voltage signal terminal, the second voltage signal terminal and a seventh node; and the first output sub-circuit being configured to transmit, under the control of the voltage at the third node, the first voltage signal from the first voltage signal terminal or the second voltage signal from the second voltage signal terminal to the seventh node;
a second output sub-circuit coupled to the seventh node, the first voltage signal terminal, the second voltage signal terminal and an eighth node; and the second output sub-circuit being configured to transmit, under control of a voltage at the seventh node, the first voltage signal from the first voltage signal terminal or the second voltage signal from the second voltage signal terminal to the eighth node; and
a third output sub-circuit coupled to the eighth node, the first voltage signal terminal, the second voltage signal terminal and the scan signal output terminal; and the third output sub-circuit being configured to transmit, under control of a voltage at the eighth node, the first voltage signal from the first voltage signal terminal or the second voltage signal from the second voltage signal terminal to the scan signal output terminal.

12. The shift register according to claim 11, wherein the first output sub-circuit includes:
a twelfth transistor, a control electrode of the twelfth transistor being coupled to the third node, a first electrode of the twelfth transistor being coupled to the first voltage signal terminal, and a second electrode of the twelfth transistor being coupled to the seventh node; and
a thirteenth transistor, a control electrode of the thirteenth transistor being coupled to the third node, a first electrode of the thirteenth transistor being coupled to the second voltage signal terminal, and a second electrode of the thirteenth transistor being coupled to the seventh node;
the second output sub-circuit includes:
a fourteenth transistor, a control electrode of the fourteenth transistor being coupled to the seventh node, a first electrode of the fourteenth transistor being coupled to the first voltage signal terminal, and a second electrode of the fourteenth transistor being coupled to the eighth node; and
a fifteenth transistor, a control electrode of the fifteenth transistor being coupled to the seventh node, a first electrode of the fifteenth transistor being coupled to the second voltage signal terminal, and a second electrode of the fifteenth transistor being coupled to the eighth node; and
the third output sub-circuit includes:
a sixteenth transistor, a control electrode of the sixteenth transistor being coupled to the eighth node, a first electrode of the sixteenth transistor being coupled to the first voltage signal terminal, and a second electrode of the sixteenth transistor being coupled to the scan signal output terminal; and
a seventeenth transistor, a control electrode of the seventeenth transistor being coupled to the eighth node, a first electrode of the seventeenth transistor being coupled to the second voltage signal terminal, and a second electrode of the seventeenth transistor being coupled to the scan signal output terminal.

13. The shift register according to claim 2, wherein the input circuit includes:
a first initialization sub-circuit coupled to the first node, the second node, the first voltage signal terminal, the second voltage signal terminal and a ninth node; and the first initialization sub-circuit being configured to transmit, under the control of the voltage at the second node, the first voltage signal from the first voltage signal terminal to the first node, or the second voltage signal from the second voltage signal terminal to the ninth node; and
a second initialization sub-circuit coupled to the signal input terminal, the first node, the first voltage signal terminal, the second voltage signal terminal and the ninth node; and the second initialization sub-circuit being configured to transmit, under the control of the input signal from the signal input terminal, the first voltage signal from the first voltage signal terminal or a voltage at the ninth node to the first node.

14. The shift register according to claim 13, wherein the first initialization sub-circuit includes:
an eighteenth transistor, a control electrode of the eighteenth transistor being coupled to the second node, a first electrode of the eighteenth transistor being coupled to the first voltage signal terminal, and a second electrode of the eighteenth transistor being coupled to the first node; and
a nineteenth transistor, a control electrode of the nineteenth transistor being coupled to the second node, a first electrode of the nineteenth transistor being coupled to the second voltage signal terminal, and a second electrode of the nineteenth transistor being coupled to the ninth node; and
the second initialization sub-circuit includes:
a twentieth transistor, a control electrode of the twentieth transistor being coupled to the signal input terminal, a first electrode of the twentieth transistor being coupled to the first voltage signal terminal, and a second electrode of the twentieth transistor being coupled to the first node; and
a twenty-first transistor, a control electrode of the twenty-first transistor being coupled to the signal input terminal, a first electrode of the twenty-first transistor being coupled to the ninth node, and a second electrode of the twenty-first transistor being coupled to the first node.

15. The shift register according to claim 1, further comprising:
a reset circuit coupled to the first voltage signal terminal, the second node and a reset signal terminal; and the reset circuit being configured to transmit, under control of a reset signal from the reset signal terminal, the first voltage signal from the first voltage signal terminal to the second node; or
the shift register further comprising the reset circuit coupled to the first voltage signal terminal, the second node and the reset signal terminal; and the reset circuit being configured to transmit, under the control of the reset signal from the reset signal terminal, the first voltage signal from the first voltage signal terminal to the second node, wherein the reset circuit includes:
a twenty-second transistor, a control electrode of the twenty-second transistor being coupled to the reset signal terminal, a first electrode of the twenty-second transistor being coupled to the first voltage signal terminal, and a second electrode of the twenty-second transistor being coupled to the second node.

16. A gate driver circuit, comprising:
at least two shift registers each according to claim 1, the at least two shift registers being cascaded.

17. The gate driver circuit according to claim 16, wherein in every two adjacent shift registers, a signal input terminal of a latter-stage shift register is coupled to a cascade signal output terminal of a former-stage shift register, and a signal input terminal of a first-stage shift register is coupled to an initialization signal terminal; and
the gate driver circuit further comprises:
a first clock signal line coupled to a first clock signal terminal of each shift register;
a second clock signal line coupled to second clock signal terminals of odd-numbered stages of shift registers; and
a third clock signal line coupled to second clock signal terminals of even-numbered stages of shift registers.

18. A driving method for a shift register, the driving method being applied to the shift register according to claim 1, wherein the input circuit is further coupled to the second node, and the output circuit is further coupled to the second voltage signal terminal; a frame period includes a charging phase and an outputting phase, and the driving method comprises:
in the charging phase:
transmitting, by the input circuit, the first voltage signal from the first voltage signal terminal to the first node under control of a low voltage of the input signal from the signal input terminal;
transmitting, by the first control circuit, the second voltage signal from the second voltage signal terminal to the second node under control of a high voltage of the first clock signal from the first clock signal terminal and a high voltage at the first node;
transmitting, by the second control circuit, a high voltage of the second clock signal from the second dock signal terminal to the third node under control of a low voltage at the second node; and
transmitting, by the output circuit, the second voltage signal from the second voltage signal terminal to the scan signal output terminal under control of a high voltage at the third node; and
in the outputting phase:
transmitting, by the input circuit, the first voltage signal from the first voltage signal terminal to the first node under the control of the low voltage at the second node;
transmitting, by the first control circuit, the second voltage signal from the second voltage signal terminal to the second node under the control of the high voltage of the first clock signal from the first clock signal terminal and the high voltage at the first node;
transmitting, by the second control circuit, a low voltage of the second dock signal from the second dock signal terminal to the third node under the control of the low voltage at the second node; and
transmitting, by the output circuit, the first voltage signal from the first voltage signal terminal to the scan signal output terminal under control of a low voltage at the third node.

19. The driving method for the shift register according to claim 18, wherein the input circuit is further coupled to the second voltage signal terminal, the first control circuit is further coupled to the first voltage signal terminal, and the second control circuit is further coupled to the first voltage signal terminal; the frame period further includes a denoising phase, and the driving method further comprises:

in the denoising phase:
transmitting, by the input circuit, the second voltage signal from the second voltage signal terminal to the first node under control of a high voltage of the input signal from the signal input terminal and a high voltage at the second node;

transmitting, by the first control circuit, the first voltage signal from the first voltage signal terminal to the second node under control of a low voltage of the first clock signal from the first clock signal terminal and a low voltage at the first node;

transmitting, by the second control circuit, the first voltage signal from the first voltage signal terminal to the third node under the control of the high voltage at the second node; and transmitting, by the output circuit, the second voltage signal from the second voltage signal terminal to the scan signal output terminal under the control of the high voltage at the third node; and/or the shift register further includes a reset circuit coupled to the first voltage signal terminal, the second node and a reset signal terminal; the frame period further includes a reset phase, and the driving method further comprises:

in the reset phase:
transmitting, by the reset circuit, the first voltage signal from the first voltage signal terminal to the second node under control of a reset signal from the reset signal terminal;

transmitting, by the input circuit, the second voltage signal from the second voltage signal terminal to the first node under control of the high voltage of the input signal from the signal input terminal and the high voltage at the second node; and transmitting, by the first control circuit, the first voltage signal from the first voltage signal terminal to the second node under control of the low voltage at the first node.

20. A display apparatus, comprising the gate driver circuit according to claim 16.

* * * * *